US012581664B2

(12) United States Patent
Seong et al.

(10) Patent No.: US 12,581,664 B2
(45) Date of Patent: Mar. 17, 2026

(54) SEMICONDUCTOR PACKAGE AND METHOD OF MANUFACTURING SAME

(71) Applicant: SAMSUNG ELECTRONICS CO., LTD., Suwon-si (KR)

(72) Inventors: Haseob Seong, Suwon-si (KR); Aenee Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 333 days.

(21) Appl. No.: 18/140,960

(22) Filed: Apr. 28, 2023

(65) Prior Publication Data

US 2024/0055379 A1    Feb. 15, 2024

(30) Foreign Application Priority Data

Aug. 10, 2022    (KR) ........................ 10-2022-0099904

(51) Int. Cl.
H01L 23/00        (2006.01)
H01L 25/065        (2023.01)
H10B 80/00        (2023.01)

(52) U.S. Cl.
CPC .............. H01L 24/08 (2013.01); H01L 24/05 (2013.01); H01L 24/80 (2013.01); H01L 24/94 (2013.01);
(Continued)

(58) Field of Classification Search
CPC ......... H01L 24/08; H01L 24/94; H01L 24/80; H01L 25/0657
See application file for complete search history.

(56) References Cited

U.S. PATENT DOCUMENTS 9,299,736 B2    3/2016 Chen et al.
9,978,694 B2 *  5/2018 Cho .................... H01L 23/3135
(Continued)

FOREIGN PATENT DOCUMENTS

KR            165353 B1    9/1998
KR    10-2020-0047845 A    5/2020
KR    10-2022-0030685 A    3/2022

OTHER PUBLICATIONS

Office Action in Korean Appln. No. 10-2022-0099904, mailed on Jan. 5, 2026, 16 pages (with English translation).

*Primary Examiner* — Dale E Page
*Assistant Examiner* — Wilner Jean Baptiste
(74) *Attorney, Agent, or Firm* — Fish & Richardson P.C.

(57)        ABSTRACT

A semiconductor package includes; a first semiconductor chip and a second semiconductor chip stacked on the first semiconductor chip. The first semiconductor chip includes; a first substrate, a first bonding pad on a first surface of the first substrate, and a first passivation layer on the first surface of the first substrate exposing at least a portion of the first bonding pad. The second semiconductor chip includes; a second substrate, a second insulation layer on a front surface of the second substrate, a second bonding pad on the second insulation layer, a first alignment key pattern on the second insulation layer, and a second passivation layer on the second insulation layer, covering at least a portion of the first alignment key pattern, and exposing at least a portion of the second bonding pad, wherein the first bonding pad and the second bonding pad are directly bonded, and the first passivation layer and the second passivation layer are directly bonded.

19 Claims, 19 Drawing Sheets

(52) U.S. Cl.
     CPC ......... *H01L 25/0657* (2013.01); *H10B 80/00*
           (2023.02); *H01L 2224/0213* (2013.01); *H01L*
               *2224/0214* (2013.01); *H01L 2224/02145*
           (2013.01); *H01L 2224/0215* (2013.01); *H01L*
               *2224/05647* (2013.01); *H01L 2224/05687*
           (2013.01); *H01L 2224/0801* (2013.01); *H01L*
               *2224/08145* (2013.01); *H01L 2224/8013*
           (2013.01); *H01L 2224/80203* (2013.01); *H01L*
               *2224/80895* (2013.01); *H01L 2224/80896*
           (2013.01); *H01L 2224/94* (2013.01); *H01L*
               *2225/06541* (2013.01); *H01L 2225/06593*
           (2013.01); *H01L 2924/1616* (2013.01); *H01L*
                                    *2924/16235* (2013.01)

(56)                    References Cited

U.S. PATENT DOCUMENTS

| | | | |
|---|---|---|---|
| 10,355,039 B2 | 7/2019 | Kotoo et al. | |
| 10,770,445 B2 * | 9/2020 | Han | H01L 21/78 |
| 10,797,001 B2 | 10/2020 | Chen et al. | |
| 11,069,647 B2 | 7/2021 | Zhou et al. | |
| 11,289,422 B2 | 3/2022 | Yan et al. | |
| 2019/0393159 A1 * | 12/2019 | Chen | H01L 24/20 |
| 2020/0020641 A1 * | 1/2020 | Ko | H01L 21/568 |
| 2020/0373253 A1 | 11/2020 | Hu et al. | |

* cited by examiner

10

M1

F I G .  7

F I G.  12
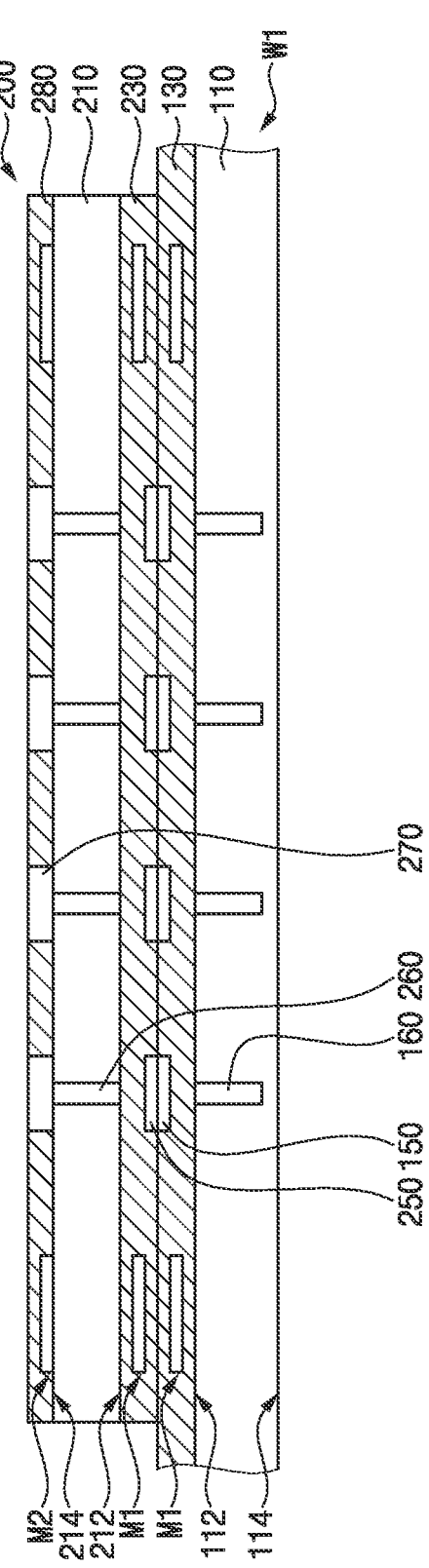

FIG. 16

SEMICONDUCTOR PACKAGE AND METHOD OF MANUFACTURING SAME

CROSS-REFERENCE TO RELATED APPLICATION

This application claims priority under 35 U.S.C. § 119 to Korean Patent Application No. 10-2022-0099904 filed on Aug. 10, 2022 in the Korean Intellectual Property Office, the subject matter of which is hereby incorporated by reference in its entirety.

BACKGROUND

1. Field

The inventive concept relates generally to semiconductor packages and methods of manufacturing same. More particularly, embodiments of the inventive concept relate to semiconductor packages including semiconductor chips that are stacked using a die-to-wafer bonding technique, as well as corresponding methods of manufacture.

2. Description of the Related Art

Multi-chip semiconductor packages include a plurality of semiconductor chips stacked one on top of the other. Multi-chip semiconductor packages may be manufactured using a die-to-wafer bonding process in which pad-to-pad direct bonding is accomplished without the use of solder bumps. In order to facilitate the die-to-wafer bonding process, alignment between stages for holing a die and a wafer may be performed using alignment key patterns respectively formed on a surface of the die and a surface of the wafer. However, due to a metal density differences between the alignment key pattern and region(s) around the alignment key pattern, topology uniformity may be degraded, thereby resulting in deterioration in interfacial bonding quality.

SUMMARY

Embodiments of the inventive concept provide semiconductor packages exhibiting improved bonding quality, as well as methods of manufacturing same.

According to embodiments of the inventive concept, a semiconductor package may include; a first semiconductor chip and a second semiconductor chip stacked on the first semiconductor chip. The first semiconductor chip includes; a first substrate including a first surface and an opposing second surface, a first bonding pad on the first surface of the first substrate, and a first passivation layer on the first surface of the first substrate exposing at least a portion of the first bonding pad. The second semiconductor chip includes; a second substrate including a front surface and an opposing back surface, a second insulation layer on the front surface of the second substrate, a second bonding pad on the second insulation layer, a first alignment key pattern on the second insulation layer, and a second passivation layer on the second insulation layer, covering at least a portion of the first alignment key pattern, and exposing at least a portion of the second bonding pad, wherein the first bonding pad and the second bonding pad are directly bonded, and the first passivation layer and the second passivation layer are directly bonded.

According to embodiments of the inventive concept, a semiconductor package may include an arrangement of stacked semiconductor chips including a buffer chip, a first semiconductor chip stacked on the buffer chip, a second semiconductor chip stacked on the first semiconductor, a third semiconductor chip stacked on the second semiconductor and a fourth semiconductor chip stacked on the third semiconductor, a sealing member covering at least a portion of the arrangement of stacked semiconductor chips, wherein each of the first semiconductor chip, the second semiconductor chip, the third semiconductor chip and the fourth semiconductor chip includes; a substrate including a front surface and an opposing back surface, an insulation layer on the front surface of the substrate, a first bonding pad on the insulation layer, a first alignment key pattern on the insulation layer, wherein the first alignment key pattern includes a main pattern and a plurality of auxiliary patterns spaced apart around the main pattern, and a first passivation layer on the insulation layer, covering at least a portion of the first alignment key pattern, and exposing at least a portion of the first bonding pad.

According to embodiments of the inventive concept, a method of manufacturing a semiconductor package may include; providing a first semiconductor wafer including a first semiconductor chip, wherein the first semiconductor chip includes a first substrate, a first insulation layer on a front surface of the first substrate, a first alignment key pattern at least partially covered by the first insulation layer, and a first bonding pad exposed through the first insulation layer, providing a second semiconductor chip including a second substrate, a second insulation layer on a back surface of the second substrate, a second alignment key pattern at least partially covered by the second insulation layer, and a second bonding pad exposed through the second insulation layer, and bonding the second semiconductor chip to the first semiconductor chip using a die bonding apparatus, such that the first bonding pad and the second bonding pad are directly bonded and the first insulation layer and the second insulation layer are directly bonded, wherein the bonding of the second semiconductor chip to the first semiconductor chip includes holding the first semiconductor wafer with a lower support structure of the die bonding apparatus, holding the second semiconductor chip with an upper support structure of the die bonding apparatus, and aligning the first semiconductor chip and the second semiconductor chip using a first imaging portion on the lower support structure to image the second alignment key pattern and using a second imaging portion on the upper support structure to image the first alignment key pattern, the first alignment key pattern includes a main pattern and a plurality of auxiliary patterns spaced apart around the main pattern.

According to embodiments of the inventive concept, a semiconductor package may include; a first semiconductor chip including a first substrate, and a second semiconductor chip including a second substrate and stacked on the first semiconductor chip, wherein the second semiconductor chip includes; insulation layers sequentially stacked on a front surface of the second substrate, a metal wiring structure including first wirings vertically stacked among the insulation layers, an alignment key structure including second wirings vertically stacked among the insulation layers, wherein an uppermost one of the second wirings includes a first alignment key pattern including a main pattern and a plurality of auxiliary patterns spaced apart around the main pattern, a second bonding pad on an uppermost one of the first wirings, and a second passivation layer on the insulation layers, covering at least a portion of the first alignment key pattern, and exposing at least a portion of the second bonding pad.

BRIEF DESCRIPTION OF THE DRAWINGS

Advantages, benefits, and features, as well as the making and use of the inventive concept may be more clearly understood upon consideration of the following detailed description together with the accompanying drawings, in which:

FIGS. 5, 6, 7, 8, 9, 10, 11, 12, 13, 14, 15, 16 and 17 (hereafter collectively, "FIGS. 5 to 17") are various plan or cross-sectional views illustrating in one example a method of manufacturing a semiconductor package according to embodiments of the inventive concept.

DETAILED DESCRIPTION

Throughout the written description and drawings, like reference numbers and labels are used to denote like or similar elements, components, stages, features and/or method steps. Throughout the written description certain geometric terms may be used to highlight relative relationships between elements, components, stages and/or features with respect to certain some embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
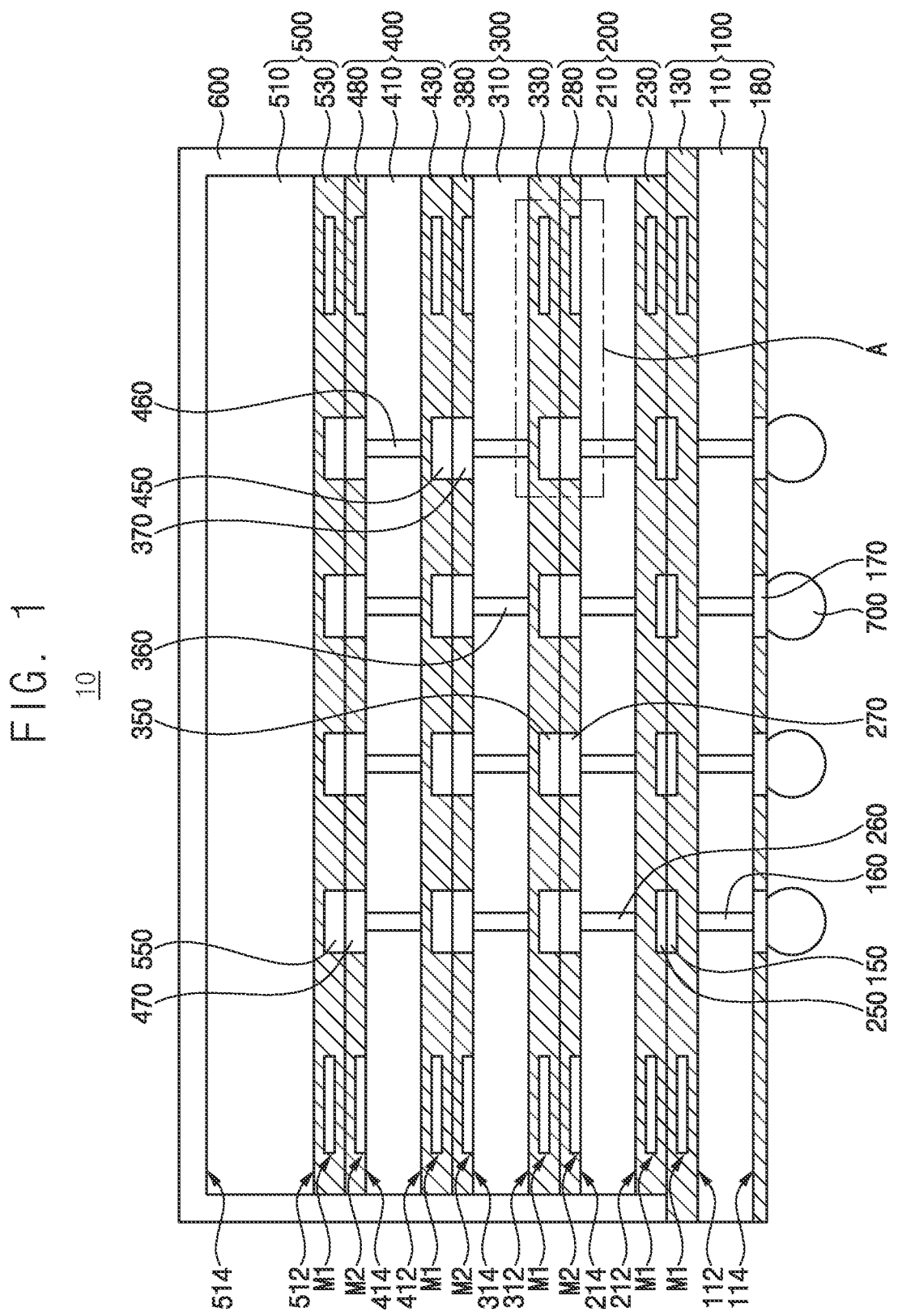
FIG. 1 is a cross-sectional view illustrating a semiconductor package according to embodiments of the inventive concept.
Figure 2:
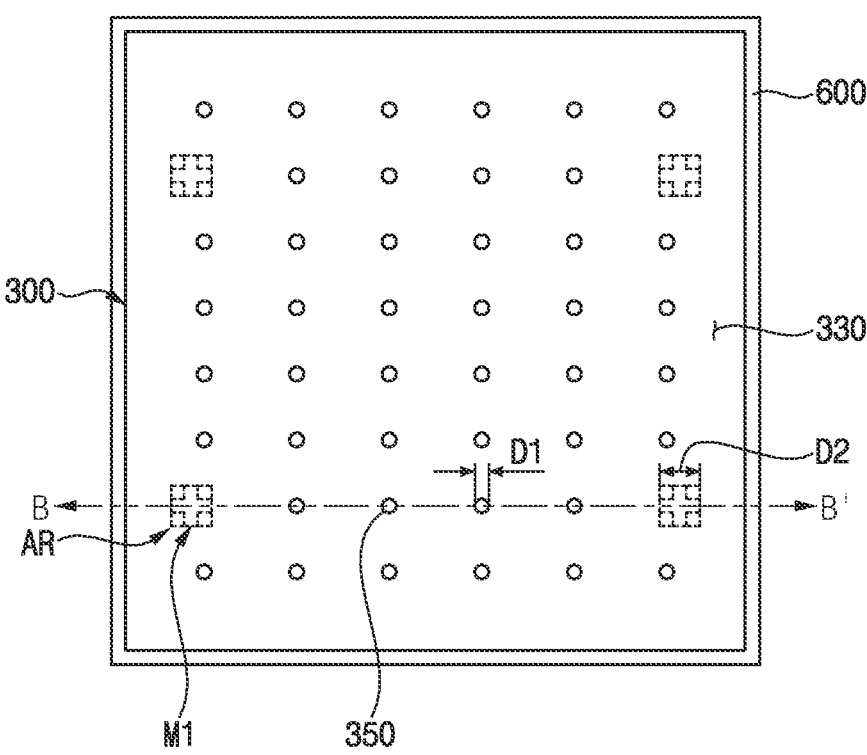
FIG. 2 is a plan (or top-down) view illustrated a first surface of the third semiconductor chip 300 of FIG. 1.
Figure 3:
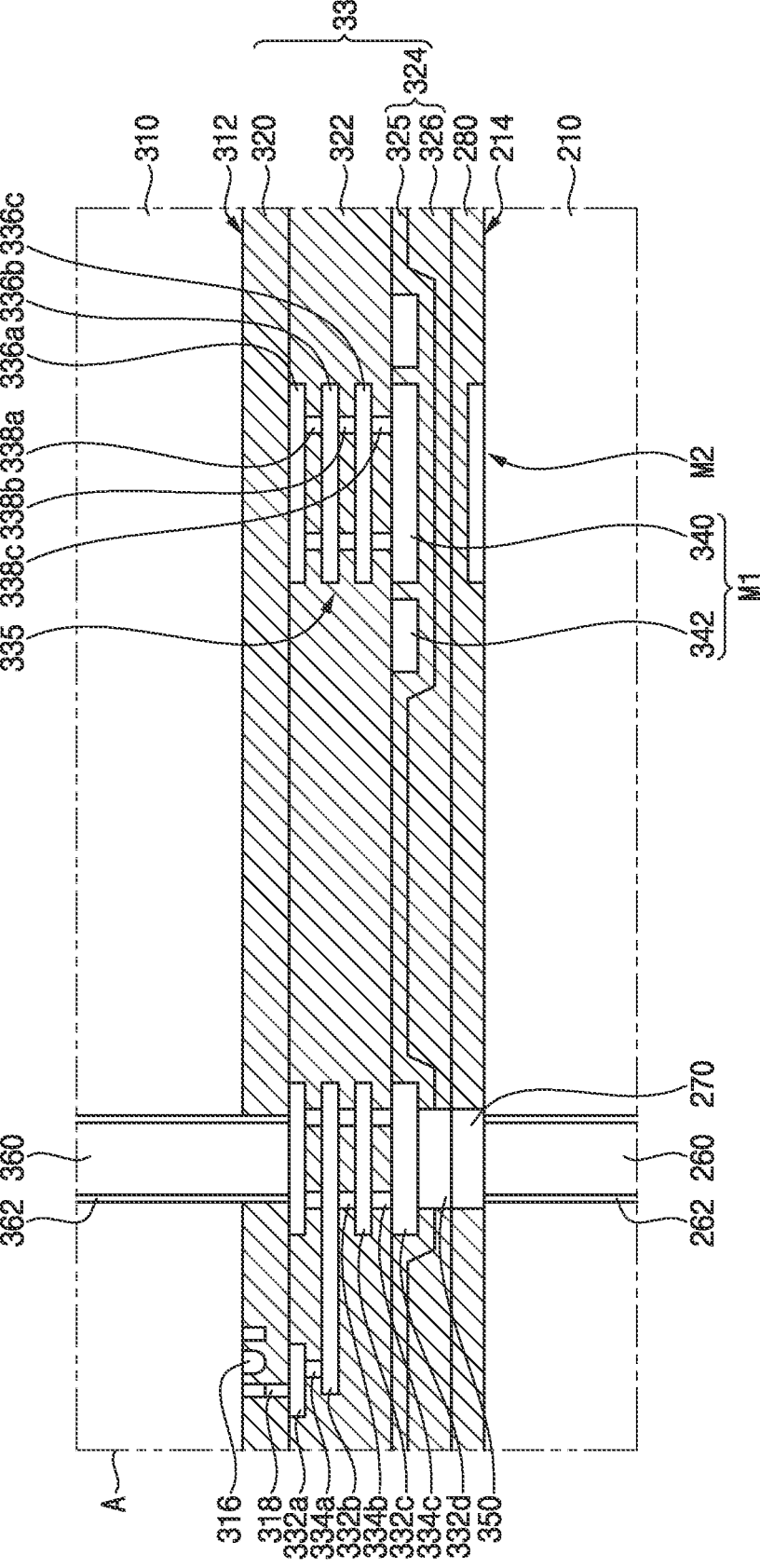
FIG. 3 is an enlarged cross-sectional view further illustrating the region 'A' indicated in FIG. 1.
Figure 4:
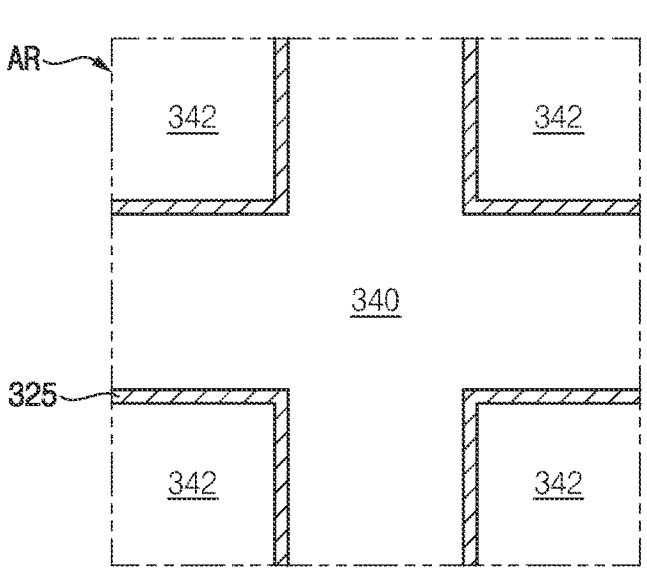
FIG. 4 is an enlarged plan view further illustrating the alignment key region (AR) indicated in FIG. 2.

FIG. 1 is a cross-sectional view illustrating a semiconductor package 10 according to embodiments of the inventive concept; FIG. 2 is a plan view further illustrated a first surface of the third semiconductor chip 300 in FIG. 1, wherein FIG. 1 is a cross-sectional view taken along the line A-A' in FIG. 2; FIG. 3 is an enlarged cross-sectional view further illustrating the region A' indicated in FIG. 1; and FIG. 4 is an enlarged plan view further illustrating the alignment key region (AR) indicated in FIG. 2.

Referring to FIGS. 1, 2, 3 and 4, the semiconductor package 10 may include a stacked arrangement of semiconductor chips (hereafter, "stacked semiconductor chips"). In the illustrated example of FIG. 1, the semiconductor package 10 includes a stacked arrangement of first, second, third, fourth and fifth (hereafter collectively, "first to fifth") semiconductor chips 100, 200, 300, 400 and 500.

For descriptive clarity, the semiconductor chips 100, 200, 300, 400 and 500 may be understood as being vertically stacked, whereas primary upper/lower surfaces or first/second surfaces of the respective semiconductor chips are assumed to laterally extend in first and second horizontal directions. In this regard, those skilled in the art will appreciate that the terms like vertical/horizontal and first/second are relative in nature and arbitrarily used for descriptive purposes.

In the illustrated example of FIG. 1, it is further assumed for descriptive simplicity that the first, second, third and fourth semiconductor chips 100, 200, 300 and 400 are substantially similar. However, this need not always be the case and other embodiments of the inventive concept may include a heterogeneous arrangement of semiconductor chips. Further, the number of stacked semiconductor chips included in various embodiments of the inventive concept may vary by design to include, as examples, stacked arrangements of 2, 4, 8, 12 or 16 semiconductor chips.

Here, each of the first to fifth semiconductor chips 100, 200, 300, 400 and 500 may include an integrated circuit that has been formed using a collection of semiconductor manufacturing processes. For example, depending in the operative nature of the constituent integrated circuit, each of the semiconductor chips may be, for example, a memory chip or a logic chip. However, in FIG. 1, the semiconductor package 10 is assumed to be a memory device, such as for example, a high bandwidth memory (HBM) device.

In some embodiments, the fifth semiconductor chip 500 may be referred to as a buffer chip supporting at least one stacked semiconductor chips (e.g., first to fourth semiconductor chips 100, 200, 300 and 400).

In some embodiments, a sealing member 600 may cover at least a portion of the semiconductor package 10.

In some embodiments, the first semiconductor chip 100 may include a first substrate 110, a first upper insulation layer 130 exposing a first bonding pad 150, and a first lower insulation layer 180 including a second bonding pad 170. Additionally, the first semiconductor chip 100 may include a first through electrode 160 penetrating through the first substrate 110.

The first substrate 110 may be understood as including a first surface 112 and an opposing second surface 114. The first surface 112 may be an active surface, whereas the second surface 114 may be a non-active surface. Thus, various circuit patterns may be provided on the first surface 112 of the first substrate 110. The first surface 112 may alternately be referred to as a frontside (or "front") surface on which the circuit patterns are formed, whereas the opposing second surface 114 may alternately be referred to as a backside (or "back") surface. That is, given the great variety of semiconductor chips that may be arranged in semiconductor packages according to embodiments of the inventive concept, one primary (i.e., horizontally extending) surface of a substrate may be referred to as a first surface and another primary surface opposing the one primary surface of the substrate may be referred to as a second surface.

In some embodiments, a first alignment key pattern M1 may be peripherally provided on the upper surface 112 of the first substrate 110. In this regard, at least three first alignment key patterns M1 may be arranged in a peripheral region of the first semiconductor chip 100. The first upper insulating layer 130 may substantially cover (or surround) the first alignment key pattern M1. One example of the first alignment key pattern M1 will be described hereafter in relation to the third semiconductor chip 300.

In some embodiments, the second semiconductor chip 200 may include a second substrate 210, a second front insulation layer 230 on a first surface 212 of the second substrate 210, and a second back insulation layer 280 on a second surface 214 of the second substrate 210. The second semiconductor chip 200 may further include a second through electrode 260 penetrating through the second substrate 210. At least a portion of a third bonding pad 250 may be exposed through the second front insulation layer 230, and at least a portion of a fourth bonding pad 270 may be exposed through the second back insulation layer 280.

The second semiconductor chip 200 may be arranged on the first semiconductor chip 100, such that the first surface 212 of the second substrate 210 faces the first surface 112 of the first substrate 110, such that the second front insulation layer 230 and the first front insulation layer 130 may be bonded directly. Accordingly, the first bonding pad 150 and the third bonding pad 250 may be bonded between the first semiconductor chip 100 and the second semiconductor chip 200 using pad to pad direct bonding (e.g., a copper-to-copper (or Cu—Cu) hybrid bonding technique). Thus, the first and second front insulation layers 130 and 230 may directly contact each other to provide a bonding structure exhibiting excellent bonding strength. Accordingly, the directly-in-contact first and second front insulation layers 130 and 230 may be bonded using, for example, a high-temperature annealing process. In this case, the resulting bonding structure may have a relatively stronger bonding strength by covalent bonding. In this context, the term "directly bonded" denotes a condition in which a first element is connected to a second element without intervening material or third element (e.g., solder bump or solder ball) therebetween.

In some embodiments, one or more alignment key patterns may be provided in relation to the first surface 212 of the second substrate 210. Here, in some embodiments, at least three first alignment key patterns M1 may be arranged in respective peripheral regions of the second semiconductor chip 200, and in some embodiments second front insulation layer 230 may cover the first alignment key pattern M1.

As further illustrated in FIG. 3, a second back insulation layer 280 may be provided on the second surface 214 of the second substrate 210, and at least a portion of the fourth bonding pad 270 may be exposed through the second back insulation layer 280. In some embodiments, the fourth bonding pad 270 may be disposed on an exposed upper surface of the second through electrode 260. Here, the second back insulation layer 280 may include at least one of, for example, silicon oxide, carbon-doped silicon oxide and silicon carbonitride (SiCN). In this manner, the third and fourth bonding pads 250 and 270 may be electrically connected by the second through electrode 260.

The third and fourth bonding pads 250 and 270 and the second through electrode 260 may include the same metal, such as for example, copper (Cu), gold (Au) or some other metal, metal alloy or conductive material(s) capable of being combined by inter-diffusion during a high-temperature annealing process.

In some embodiments, a second alignment key pattern M2 may be provided on the second surface 214 of the second substrate 210. For example, in some embodiments at least three second alignment key patterns M2 may be formed in a respective peripheral region of the second semiconductor chip 200. The second back insulation layer 280—acting as a fourth passivation layer—may cover the second alignment key pattern M2 having been formed on the second surface 214 of the second substrate 210.

The second alignment key pattern M2 may have a structure substantially similar to that of the first alignment key pattern M1. For example, the second alignment key pattern M2 may include only a structure corresponding to a main (or centrally disposed) pattern 340 of the first alignment key pattern M1 while omitting auxiliary pattern(s) 342 disposed proximate to the main pattern 340. Accordingly, the overall size of the second alignment key pattern M2 may less than that of the first alignment key pattern M1.

In some embodiments, the third semiconductor chip 300 may include a third substrate 310, a third front insulation layer 330 on a front surface 312 of the third substrate 310, and a third back insulation layer 380 on a back surface 314 of the third substrate 310. The third semiconductor chip 300 may further include a third through electrode 360 penetrating through the third substrate 310. At least a portion of a fifth bonding pad 350 may be exposed through the third front insulation layer 330, and at least a portion of a sixth bonding pad 370 may be exposed through the third back insulation layer 380.

Referring to FIG. 3, the third substrate 310 may be understood as including a first surface 312 and an opposing second surface 314. Circuit patterns and cells may be formed on the first surface 312 of the third substrate 310, wherein the circuit patterns 316 may include at least one of a transistor, a capacitor, a diode, or similar circuit element(s). Accordingly, the third semiconductor chip 300 may include various circuit elements formed in relation to the first surface 312. In this regard, the various circuit patterns may be formed using certain front end of line (FEOL) process(es) associated with the manufacture of semiconductor devices on the first surface 312 of the third substrate 310. The first surface 312 of the third substrate 310 on which the FEOL process(es) are performed may be referred to as the front surface, whereas the second surface 314 opposing the front surface 312 may be referred to as a back surface.

The third front insulation layer 330 may be formed as an insulation interlayer on the first surface 312 of the third substrate 310. The third front insulation layer 330 may include a plurality of insulation layers 320, 322 and 324 and various wirings extending among in the plurality of insulation layers. The fifth bonding pad 350 may be exposed through an outermost insulation layer of the third front insulation layer 330.

For example, in the illustrated example of FIG. 3, the third front insulation layer 330 includes a first insulation interlayer 320, a second insulation interlayer 322 and a fifth passivation layer 324.

The first insulation interlayer 320 may be provided on the first surface 312 of the third substrate 310 to cover the circuit patterns 316 on the first surface 312 of the third substrate 310. The first insulation interlayer 320 may include, for example, silicon oxide or a low dielectric material. The first insulation interlayer 320 may include lower wirings 318 therein.

The second insulation interlayer 322 may include buffer layers and insulation layers stacked alternately on one another. For example, the buffer layers include silicon nitride, silicon carbon nitride (SiCN), silicon carbon oxynitride (SiCON), etc. The insulation layer may include silicon oxide, carbon doped silicon oxide, silicon carbon nitride (SiCN), etc.

The second insulation interlayer 322 may include a plurality of metal wirings. For example, the second insulation interlayer 322 may include a metal wiring structure including a plurality of first wirings vertically stacked in the buffer layers and the insulating layers. The plurality of the first wirings may include a first metal wiring 332*a*, a first contact 334*a*, a second metal wiring 332*b*, a second contact 334*b*, a third metal wirings 332*c*, a third contact 234*c* and a fourth metal wiring 332*d*. The fourth metal wiring 332*d* may be provided on the second insulation interlayer 322 as an uppermost (or outermost) first wiring. The fourth metal wiring 332*d* may have a thickness greater than a thickness of each of the first to third metal wirings. The fifth bonding pad 350 may be provided on the fourth metal wiring 332*d* as an uppermost first wiring.

The fifth passivation layer 324 may be formed on the second insulation interlayer 322 and may expose at least a portion of the fifth bonding pad 350. The third passivation layer 324 may include a plurality of stacked insulation layers. For example, the third passivation layer 324 may include an organic passivation layer 325 having an oxide layer and an inorganic passivation layer 326 having a nitride layer that are sequentially stacked. The inorganic passivation layer 326 may include silicon nitride or silicon carbonitride.

The fifth bonding pad 350 may be exposed through an outermost insulation layer of the third front insulation layer 330. Thus, the fifth bonding pad 350 may be exposed through an outer surface of the third front insulation layer 330. Accordingly, the circuit pattern 316 may be electrically connected to the fifth bonding pad 350 using the lower wirings and other wirings.

In some embodiments, the second insulation interlayer 322 may include an alignment key structure 335. The alignment key structure 335 may include a plurality of second wirings vertically stacked in the buffer layers and insulating layers. For example, the plurality of second wirings may include a first metal wiring 336*a*, a first contact 338*a*, a second metal wiring 336*b*, a second contact 338*b*, a third metal wiring 336*c*, and a third contact 338*c* and a first alignment key pattern M1. The first alignment key pattern M1 may be provided on the second insulation interlayer 322 as an uppermost second wiring. The first alignment key pattern M1 may have a thickness greater than that of the first, second and third metal wirings 336*a*, 336*b* and 336*c*.

Referring to FIGS. 2 and 4, the first alignment key pattern M1 may include the main pattern 340 and a plurality of auxiliary patterns 342 proximate to (or "around") the main pattern 340 and variously spaced apart from the main pattern 340. The first alignment key pattern M1 may be arranged in an alignment key pattern region AR as a search region.

In some embodiments, at least three first alignment key patterns M1 may be formed in respective peripheral regions of the third semiconductor chip 300. Here, each fifth bonding pad 350 may have a first diameter D1, and each first alignment key pattern M1 may have a second diameter D2, wherein the first diameter D1 falls within a range of between about 5 μm to about 15 μm and the second diameter D2 falls within a range of between about 20 μm to about 35 μm. In this regard, the particular size of the first alignment key pattern M1 may be determined in consideration of the resolution of an imaging camera of a die bonding apparatus 50 described hereafter in some additional detail.

In some embodiments like the one illustrated in FIGS. 2 and 4, the main pattern 340 may have cross-shaped structure, wherein the main pattern 340 is further characterized by a metal portion having a ratio of at least 60% of the search box and four (4) auxiliary patterns 342 are characterized by respective square patterns disposed at the opposing four corners of the search box. Here, the auxiliary patterns 342 may include the same material formed at substantially the same thickness as the main pattern 340. Given the foregoing arrangement of main and auxiliary patterns 340 and 342, each first alignment key pattern M1 may have a metal portion greater than 60% of the entire search box.

The third passivation layer 324 may cover, wholly or in part, the first alignment key pattern M1 formed on the third insulation interlayer 322. Since the first alignment key pattern M1 includes a plurality of the auxiliary patterns 342 disposed around the main pattern 340 and spaced apart from each other, the metal density between the main pattern 240 and the insulation layer region around the main pattern 240 may be increased uniformly to improve topology uniformity. Accordingly, generation of voids between the main pattern 240 and the fifth passivation layer 324 may be prevented and a dishing effect may be improved.

The third through electrode 360 may penetrate through the first insulation interlayer 320 and extend through the third substrate to a predetermined depth from the first surface 312 of the third substrate 310. The third through electrode 360 may contact the first metal wiring 332*a*. Accordingly, the third through electrode 360 may be electrically connected to the fifth bonding pad 350 by the wirings.

In some embodiments, a liner layer 362 may be provided on an outer surface of the third through electrode 360. The liner layer may include silicon oxide or carbon doped silicon oxide. Thus, the liner layer 352 may electrically insulate the third substrate 310 and the third front insulation layer 330 from the third through electrode 360.

As illustrated in FIG. 3, the third semiconductor chip 300 may be stacked on the second semiconductor chip 200 such that the first (or front) surface 312 of the third substrate 310 faces the second (or back) surface 214 of the second substrate 210. The third front insulation layer 330 and the second back insulation layer 280 may be directly bonded to each other. Accordingly, the fourth bonding pad 270 and the fifth bonding pad 350 may be directly bonded between the second semiconductor chip 200 and the third semiconductor chip 300 by pad to pad direct bonding.

The outermost insulation layers of the second back insulation layer 280 and the third front insulation layer 330 may contact each other, thereby providing a bonding structure having excellent bonding strength. Further, the directly-in-contact second back insulation layer 280 and the third front insulation layer 330 may be bonded using a high-temperature annealing process. In this case, the bonding structure may have a relatively stronger bonding strength by covalent bonding.

Referring to FIG. 4, the fourth semiconductor chip 400 may include a fourth substrate 410, a fourth front insulation layer 430 on a front surface 412 of the fourth substrate 410, and a fourth back insulation layer 480 on a back surface 414 of the fourth substrate 410. The fourth semiconductor chip 400 may further include a fourth through electrode 460 penetrating through the fourth substrate 410. At least a portion of a seventh bonding pad 450 may be exposed through an outermost insulation layer of the fourth front insulation layer 430, and at least a portion of a seventh bonding pad 450 may be exposed through an outermost insulation layer of the fourth back insulation layer 480.

In some embodiments, a first alignment key pattern M1 may be provided on the first surface 412 of the fourth substrate 410. In some embodiments, at least three first alignment key patterns M1 may be respectively arranged in peripheral regions of the fourth semiconductor chip 400. The fourth front insulation layer 430 may cover, wholly or in part, the first alignment key pattern M1.

At least one second alignment key pattern M2 may be disposed on the second surface 414 of the fourth substrate 410. In some embodiments, at least three second alignment key patterns M2 may be arranged in respective peripheral regions of the fourth semiconductor chip 400. The fourth back insulation layer 480 as an eighth passivation layer covering the second alignment key pattern M2 formed on the second surface 414 of the fourth substrate 410.

The fifth semiconductor chip 500 may include a fifth substrate 510 and a fifth front insulation layer 530 provided on a front surface 512 of the fifth substrate 510. At least a portion of a ninth bonding pad 550 may be exposed through an outermost insulation layer of the fifth front insulation layer 530.

In some embodiments, the second semiconductor chip 200 may be bonded to the first semiconductor chip 100, such that a front surface of the second semiconductor chip 200 (i.e., the front surface 212 of the second substrate 210) faces a front surface of the first semiconductor chip 100 (i.e., the front surface 112 of the first substrate 110). The first front insulation layer 130 of the first semiconductor chip 100 and the second front insulation layer 230 of the second semiconductor chip 200 may be bonded directly. The first bonding pad 150 of the first semiconductor chip 100 may be bonded directly to the third bonding pad 250 of the second semiconductor chip 200. Accordingly, the first bonding pad 150 and the third bonding pad 250 may be bonded between the first semiconductor chip 100 and the second semiconductor chip 200 using pad to pad direct bonding.

The third semiconductor chip 300 may be bonded to the second semiconductor chip 200 such that a front surface of the third semiconductor chip 300, i.e., the front surface 312 of the third substrate 310 faces a back surface of the second semiconductor chip 200, i.e., the back surface 214 of the second substrate 210. The second back insulation layer 280 of the second semiconductor chip 200 and the third front insulation layer 330 of the third semiconductor chip 300 may be bonded directly to each other. The fourth bonding pad 270 of the second semiconductor chip 200 may be bonded directly to the fifth bonding pad 350 of the third semiconductor chip 300. Accordingly, the fourth bonding pad 270 and the fifth bonding pad 350 may be bonded to each other between the second semiconductor chip 200 and the third semiconductor chip 300 using pad to pad direct bonding.

The fourth semiconductor chip 400 may be bonded to the third semiconductor chip 300, such that a front surface of the fourth semiconductor chip 400 (i.e., the front surface 412 of the fourth substrate 410) faces a back surface of the third semiconductor chip 300 (i.e., the back surface 314 of the third substrate 310). The third back insulation layer 380 of the third semiconductor chip 300 and the fourth front insulation layer 430 of the fourth semiconductor chip 400 may be bonded directly to each other. The sixth bonding pad 370 of the third semiconductor chip 300 may be directly bonded to the seventh bonding pad 450 of the fourth semiconductor chip 400. Accordingly, the sixth bonding pad 370 and the seventh bonding pad 450 may be bonded to each other between the third semiconductor chip 300 and the fourth semiconductor chip 400 using pad to pad direct bonding (e.g., Cu—Cu hybrid bonding).

The fifth semiconductor chip 500 may be bonded to the fourth semiconductor chip 400 such that a front surface of the fifth semiconductor chip 500 (i.e., the front surface 512 of the fifth substrate 510) faces a back surface of the fourth semiconductor chip 400 (i.e., the back surface 414 of the fourth substrate 410). The fourth back insulation layer 480 of the fourth semiconductor chip 400 and the fifth front insulation layer 530 of the fifth semiconductor chip 500 may be bonded directly to each other. The eighth bonding pad 470 of the fourth semiconductor chip 400 may be directly bonded to the ninth bonding pad 540 of the fifth semiconductor chip 500. Accordingly, the eighth bonding pad 470 and the ninth bonding pad 550 may be bonded between the fourth semiconductor chip 400 and the fifth semiconductor chip 500 pad to pad direct bonding.

In some embodiments, the semiconductor package 10 may further include a sealing member 600 covering the second, third, fourth and fifth semiconductor chips 200, 300, 400 and 500 on the first semiconductor chip 100. The sealing member 600 may cover side surfaces of the second, third, fourth and fifth semiconductor chips 200, 300, 400 and 500. The sealing member 600 may cover an upper surface of the fifth semiconductor chip 500. Here, the sealing member 600 may include, for example a thermosetting resin or the like.

Additionally, the semiconductor package 10 may variously include solder bumps 700 as conductive connection members respectively disposed on the second bonding pads 170 of the first semiconductor chip 100.

As described above, each of the second, third fourth and fifth semiconductor chips 200, 300, 400 and 500 sequentially stacked on the first semiconductor chip 100 may include at least one first alignment key pattern M1 provided on each respective front surface of a corresponding substrate, wherein each first alignment key pattern M1 includes a main pattern and a plurality of the auxiliary patterns spaced apart from each other and disposed around the main pattern. Additionally, each of the second to fifth semiconductor chips 200, 300, 400 and 500 may include at least one second alignment key pattern M2 provided on the back surface of the substrate. In some embodiments, the auxiliary patterns may be disposed around the main pattern, such that the first alignment key pattern M1 has a metal portion at a ratio of at least 60% with respect to the entire search box.

Accordingly, topology uniformity may be improved by ensuring that metal density is uniform between the main pattern and the insulating layer region around the main pattern. Thus, generation of voids between the main pattern and the passivation layer on the main pattern may be prevented and a dishing effect may be improved to thereby improve bonding quality in a hybrid bonding process.

Hereinafter, an exemplary method of manufacturing the semiconductor package 10 of FIG. 1 (e.g., a high bandwidth memory (HBM) device) will be described in relation to FIGS. 5 to 17.

Figure 5:
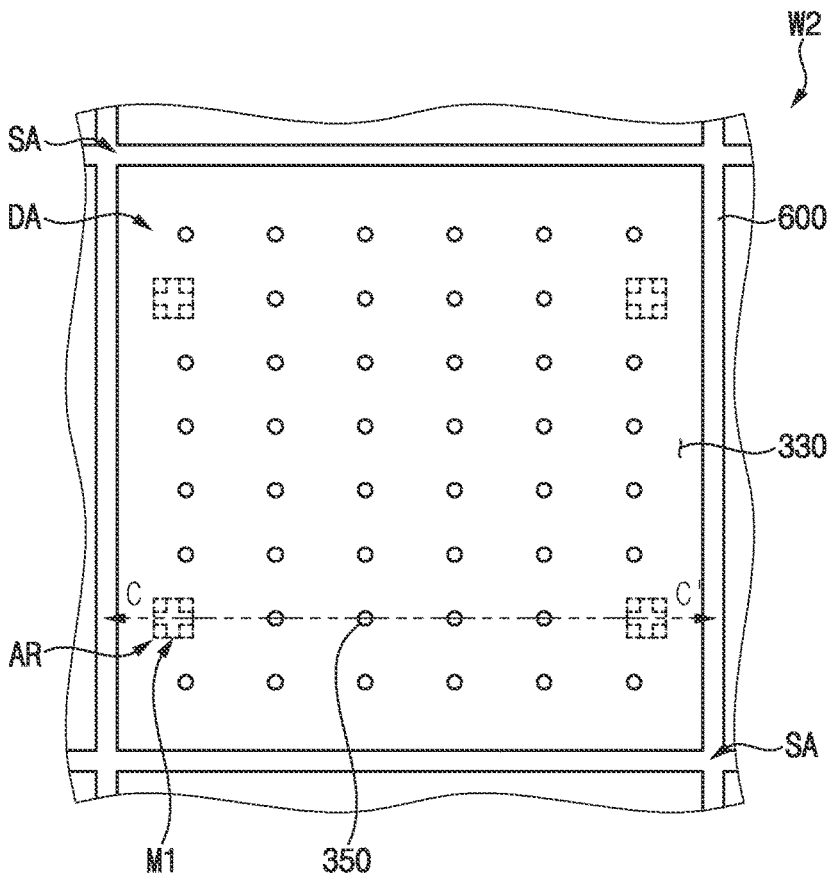
Figure 6:
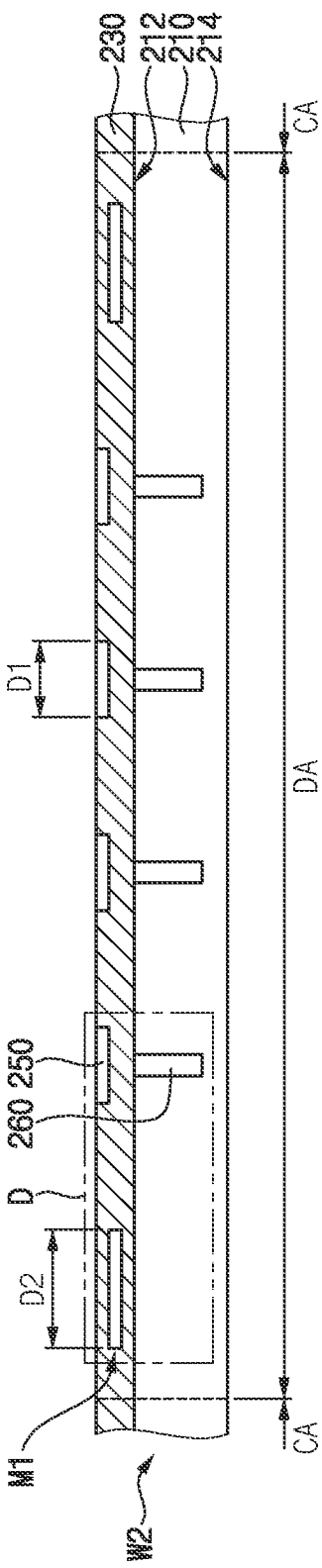
Figure 7:
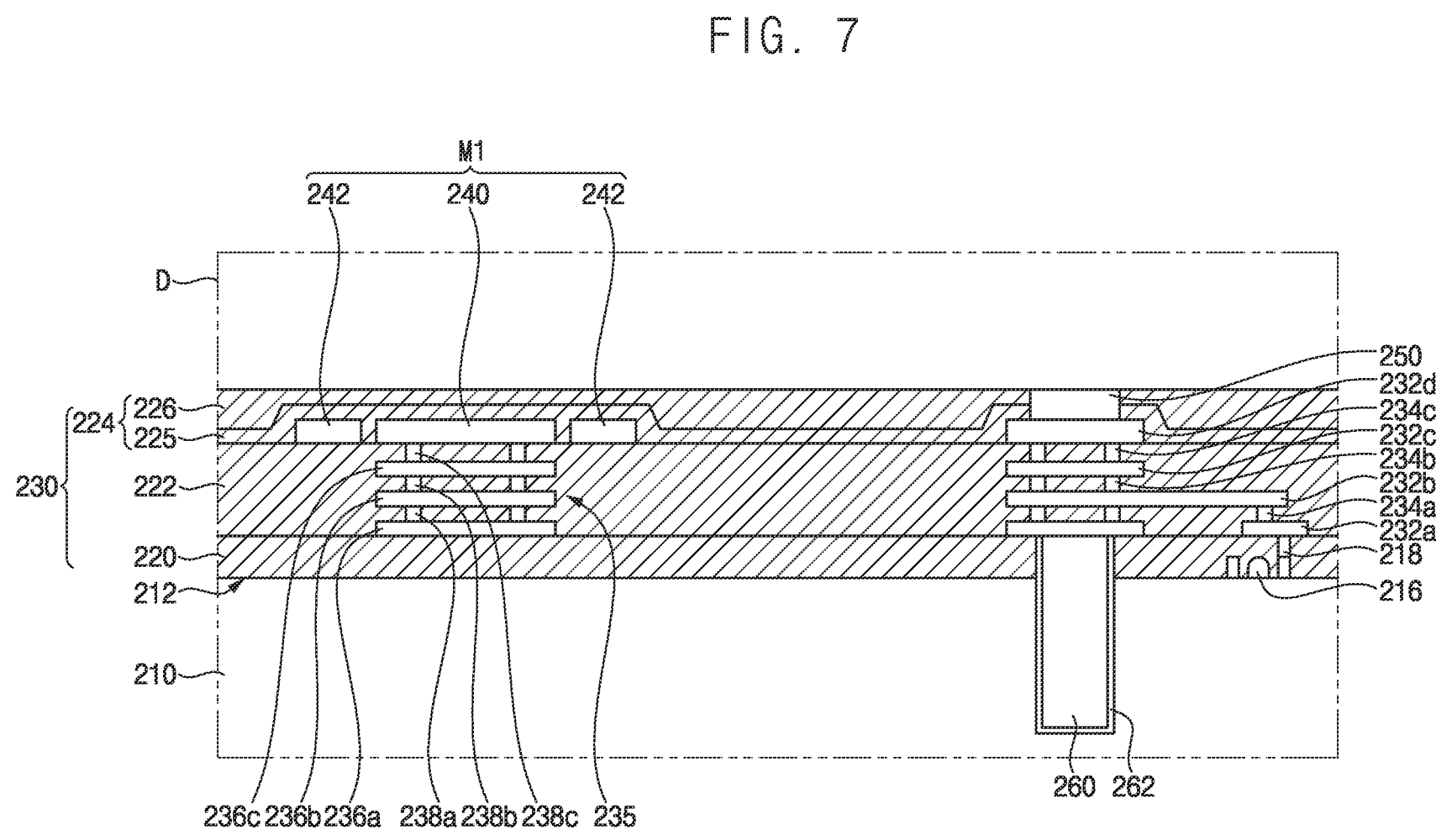
Figure 8:
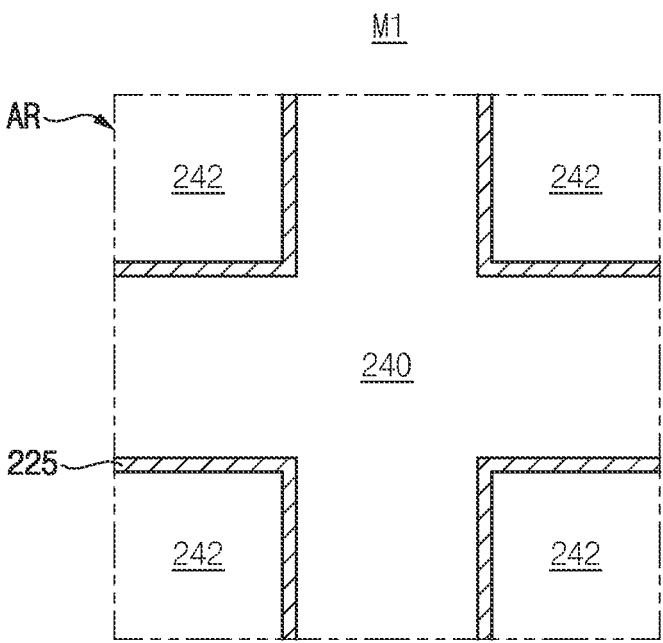

Here, FIG. 5 is a plan view of the third semiconductor chip 300, or more particularly the third front insulation layer 330 on the front surface of the third semiconductor chip 300 of FIG. 1; FIG. 6 is a cross-sectional view taken along the line C-C' of in FIG. 5; FIG. 7 is an enlarged cross-sectional view further illustrating the region 'D' indicated in FIG. 6; and FIG. 8 is an enlarged view further illustrating an alignment key region of FIG. 5

Referring collectively to FIGS. 5, 6, 7, and to 8, a second wafer W2 including a plurality of second semiconductor chips (dies) formed therein is prepared.

In some embodiments, the second wafer W2 may include the second substrate 210 and the second front insulation layer 230 including the third bonding pad 250 provided in an outer surface thereof. Additionally, the second wafer W2 may include the second through electrode 260 provided in the second substrate 210 and electrically connecting the third bonding pad 250.

The second substrate 210 is again assumed to include the first surface 212 and the opposing second surface 214. The second substrate 210 may include a die region DA wherein circuit patterns and cells are formed and a scribe lane region SA substantially surrounding the die region DA. The second substrate 210 may be separated (e.g., sawed) along the scribe lane region SA to thereby singulate respective die regions DA.

For example, the second substrate 210 may include may include silicon, germanium, silicon-germanium, or III-V compounds, e.g., GaP, GaAs, GaSb, etc. In some embodiments, the second substrate 210 may be a silicon-on-insulator (SOI) substrate, or a germanium-on-insulator (GOI) substrate.

The various circuit patterns 216 may include circuit elements, as noted above. Accordingly, the second semiconductor chip 200 may constitute a semiconductor device including a plurality of the circuit elements.

The second front insulation layer 230 may be formed as an insulation interlayer on the first surface 212 of the second substrate 210. The second front insulation layer 230 may include a plurality of insulation layers and wirings in the insulation layers. The third bonding pad 250 may be provided in the outermost insulation layer of the second front insulation layer 230.

As shown in FIG. 7, the second front insulation layer 230 may include a first insulation interlayer 220, a second insulation interlayer 222 and a third passivation layer 224.

The first insulation interlayer 220 may be provided on the first surface 212 of the second substrate 210 and may cover the circuit patterns 216 on the first surface 212 of the second substrate 210. The first insulation interlayer 220 may include, for example, silicon oxide or a low dielectric material. The first insulation interlayer 220 may include lower wirings 218 therein.

The second insulation interlayer 222 may include buffer layers and insulation layers stacked alternately on one another. For example, the buffer layers include silicon nitride, silicon carbon nitride (SiCN), silicon carbon oxynitride (SiCON), etc. The insulation layer may include silicon oxide, carbon doped silicon oxide, silicon carbon nitride (SiCN), etc.

The second insulation interlayer 222 may include a plurality of metal wirings. For example, the second insulation interlayer 222 may include a metal wiring structure including a plurality of first wirings vertically stacked in the buffer layers and the insulating layers. The plurality of the first wirings may include a first metal wiring 232a, a first contact 234a, a second metal wiring 232b, a second contact 234b, a third metal wirings 232c, a third contact 234c and a fourth metal wiring 232d. The fourth metal wiring 232d may be provided on the second insulation interlayer 222 as an uppermost first wiring. The fourth metal wiring 232d may have a thickness greater than a thickness of each of the first to third metal wirings. The third bonding pad 250 may be provided on the fourth metal wiring 232d as the uppermost first wiring.

The third passivation layer 224 may be formed on the second insulation interlayer 222 and may expose at least a portion of the third bonding pad 250. The third passivation layer 224 may include a plurality of stacked insulation layers. For example, the third passivation layer 224 may include an organic passivation layer 225 having an oxide layer and an inorganic passivation layer 226 having a nitride layer that are sequentially stacked. The inorganic passivation layer 226 may include silicon nitride or silicon carbonitride.

The third bonding pad 250 may be provided in an outermost insulation layer of the second front insulation layer 230. The third bonding pad 250 may be exposed through an outer surface of the second front insulation layer 230. Accordingly, the circuit pattern 216 may be electrically connected to the third bonding pad 250 by the lower wirings and the wirings.

In some embodiments, the second insulation interlayer 222 may include an alignment key structure 235. The alignment key structure 235 may include a plurality of second wirings vertically stacked in the buffer layers and insulating layers. The plurality of second wirings may include a first metal wiring 236a, a first contact 238a, a second metal wiring 236b, a second contact 238b, a third metal wiring 236c, and a third contact 238c and a first alignment key pattern M1. The first alignment key pattern M1 may be provided on the second insulation interlayer 222 as an uppermost second wiring. The first alignment key pattern M1 may have a thickness greater than each of the first to third metal wirings.

As shown in FIG. 8, the first alignment key pattern M1 may include a main pattern 240 and a plurality of auxiliary patterns 242 disposed around the main pattern 240 and spaced apart from the main pattern 240. The first alignment key pattern M1 may be arranged in an alignment key pattern region AR as a search region.

At least three first alignment key patterns M1 may be formed in a peripheral region of the die area DA. The third bonding pad 250 may have a first diameter D1, and the first alignment key pattern M1 may have a second diameter D2, wherein the first diameter D1 falls in a range of between about 5 μm to 15 μm, and the second diameter D2 falls in a range of between about 20 μm to 35 μm. As noted above, the size of the first alignment key pattern M1 may be determined in consideration of the resolution of an imaging camera of a die bonding apparatus 50 described hereafter.

The third passivation layer 224 may cover, wholly or in part, the first alignment key pattern M1 formed on the second insulation interlayer 222. Since the first alignment key pattern M1 includes a plurality of the auxiliary patterns 242 around the main pattern 240 and spaced apart from each other, the metal density between the main pattern 240 and the insulation layer region around the main pattern 240 may be uniformly formed improve topology uniformity. Accordingly, generation of voids between the main pattern 240 and the third passivation layer 224 may be prevented and a dishing effect may be improved.

The second through electrode 260 may penetrate through the first insulation interlayer 220 and extend through the second substrate to a predetermined depth from the first surface 212 of the second substrate 210. The second through electrode 260 may make contact with the first metal wiring 232a. Accordingly, the second through electrode 260 may be electrically connected to the third bonding pad 250 by the wirings.

A liner layer 262 may be provided on an outer surface of the second through electrode 260. The liner layer may include silicon oxide or carbon doped silicon oxide. The liner layer 252 may insulate electrically the second substrate 210 and the second front insulation layer 230 from the second through electrode 260.

Figure 9:
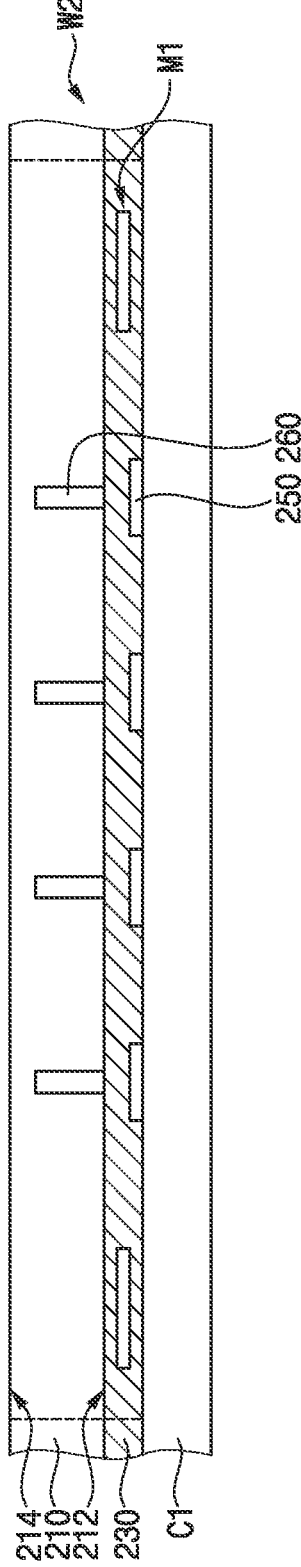
Figure 10:
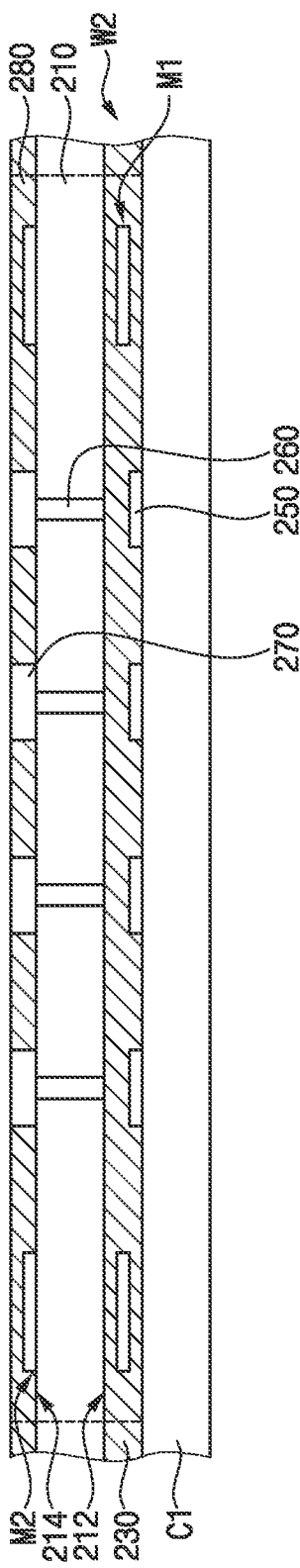

FIGS. 9 and 10 are respective cross-sectional views further illustrating in one example the connection of the second through electrode 260 and the fourth bonding pad 270.

Referring to FIG. 9, a back surface (or second surface 214) of the second substrate 210 may be thinned (e.g., by application of mechanical grinding) using a substrate support system (WSS). That is, after attaching the second wafer W2 to a carrier substrate C1 using (e.g.,) an adhesive film, the second surface 214 of the second substrate 210 may be partially removed until a portion of the second through electrode 260 is exposed. In this regard, the second surface 214 of the second substrate 210 may be partially removed using a chemical mechanical polishing (CMP) process. Accordingly, a thickness of the second substrate 210 may be reduced to a desired thickness of about 40 μm to about 150 μm. In addition, an end portion of the second through electrode 260 may be exposed from the second surface 214 of the second substrate 210.

Referring to FIG. 10, the second back insulation layer 280 including the fourth bonding pad 270 electrically connected to the second through electrode 260 may be formed on the second surface 214 of the second substrate 210. That is, after forming the second back insulation layer 280 on the second surface 214 of the second substrate 210, an opening may be formed in the second back insulation layer 280 to expose the second through electrode 260 and a plating process may be performed to form the fourth bonding pad 270. The fourth bonding pad 270 may be disposed on the exposed surface of the second through electrode 260. The second back insulation layer 280 may include silicon oxide, carbon-doped silicon oxide, silicon carbonitride (SiCN), etc. Accordingly, the third and fourth bonding pads 250 and 270 may be electrically connected through the second through electrode 260.

In some embodiments, at least one second alignment key pattern M2 may be formed on the second surface 214 of the second substrate 210. In some embodiments, at least three second alignment key patterns M2 may be formed in a peripheral region of the die area DA. The second back insulation layer 280 may cover, wholly or in part, the second alignment key pattern M2 formed on the second surface 214 of the second substrate 210. The second alignment key pattern M2 may have a structure substantially similar to that of the first alignment key pattern M1. For example, the second alignment key pattern M2 may include only a structure corresponding to the main pattern 240 of the first alignment key pattern M1. A size of the second alignment key pattern M2 may therefore be equal to or less than that of the first alignment key pattern M1.

Figure 11:
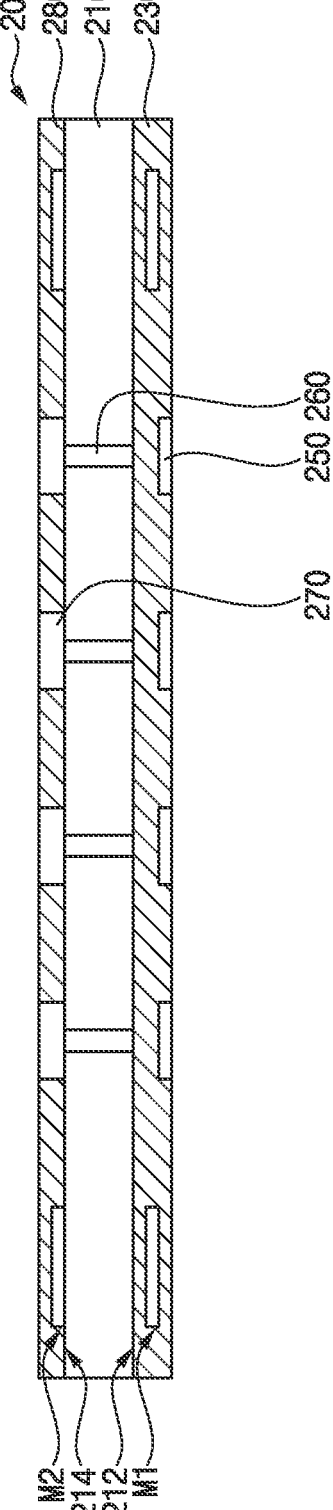

Referring to FIG. 11, the second wafer W2 may be cut along the scribe lane region SA to form an individual second semiconductor chips 200.

Referring to FIGS. 12, a plurality of the second semiconductor chips 200 may be attached to a first wafer W1 (e.g.,) using a die-to-wafer hybrid bonding process. In some embodiments, the plurality of second semiconductor chips 200 may be disposed on the first wafer W1 in the die regions DA of the first wafer W1. That is, the plurality of second semiconductor chips 200 may be stacked on the first wafer W1 in such a manner that the first surface 212 of the second substrate 210 of the second semiconductor chip 200 faces the first wafer W1.

Figure 13:
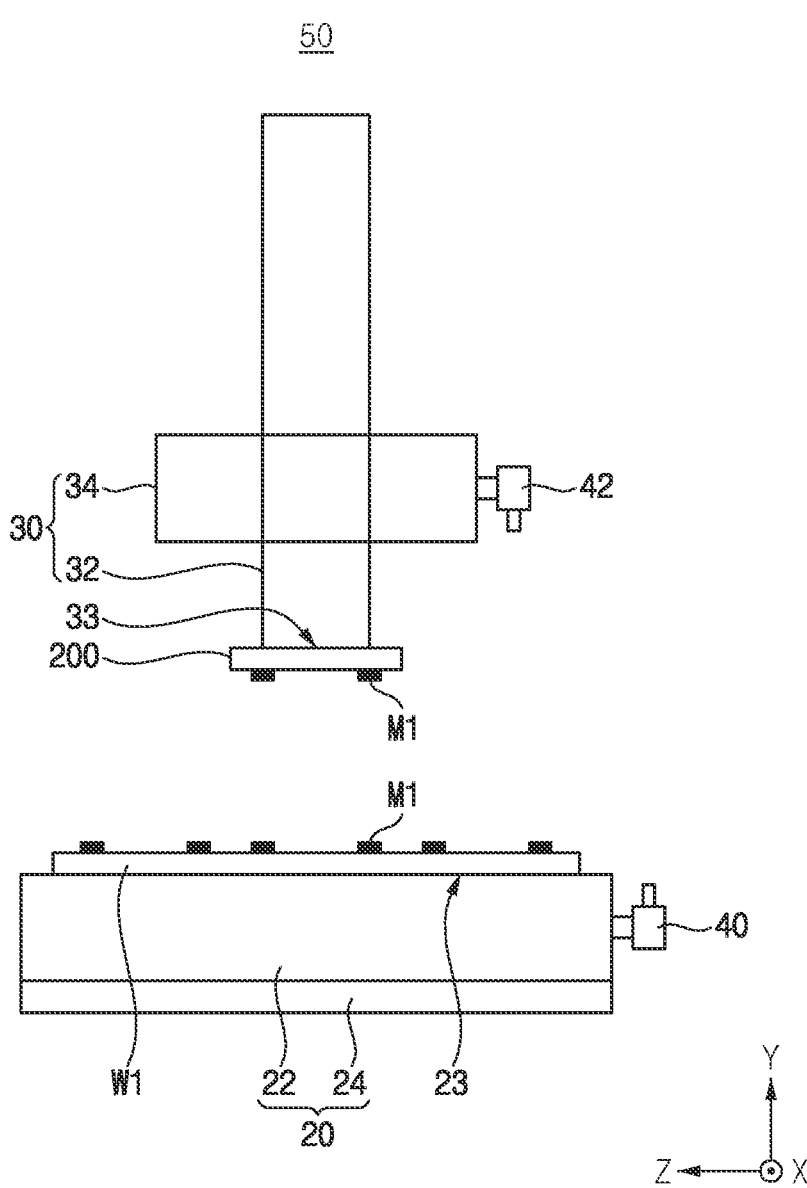

Referring to FIG. 13, a die bonding apparatus 50 may be used to pick up the second semiconductor chip 200, after it has been singulated (e.g., separated using a sawing process), properly position the second semiconductor chip in relation to the first wafer W1, and then bond the second semiconductor chip to the first wafer W1.

For example, a lower support structure 20 of the die bonding apparatus 50 may include a first stage 22 that holds the first wafer W1, and an upper support structure 30 may include a second stage 32 that holds the second semiconductor chip 200. A bonding head driver 34 may attach the second semiconductor chip 200 using the upper support structure 30 serving as a bonding head. Then, the second semiconductor chip 200 may be moved using the bonding head to a desired position on the first wafer W1. In this regard, the bonding head driver 34 may move the bonding head laterally (e.g., in X and Y directions) and vertically (e.g., in a Z direction). Alternately, the bonding head driver 34 may move the bonding head in the Z direction, and a first stage driver 24 (among other drivers) may move the first wafer W1 in the X direction and the Y directions, and/or rotate the first wafer W1 about the center of the first wafer W1.

The die bonding apparatus 50 may include a first imaging portion 40 and a second imaging portion 42 for wafer and die alignment measurement. To perform an alignment process, the first imaging portion 40 (e.g., a first camera) may be used to image the first alignment key patterns M1 of the second semiconductor chip 200, and the second imaging portion 42 (e.g., a second camera) may be used to image the first alignment key patterns M1 of the first wafer W1. Such imaging may then be used to determine (e.g., calculate or measure) respective, absolute positions for the second semiconductor chip 200 and the first wafer W1.

The second semiconductor chips 200 may be attached on an upper (or first) surface 112 of the first wafer W1 using a thermal compression process at a predetermined temperature (e.g., a temperature of about 400° C. or less). Using the thermal compression process, the second semiconductor chip 200 and the first wafer W1 may be bonded to each other by hybrid bonding. For example, the second front insulation layer 230 on the front surface of the second semiconductor chip 200 (i.e., the first surface 212 of the second substrate 210) may be directly bonded to a first front insulation layer 130 on a first substrate 110 of the first wafer W1.

Further in this regard, the first bonding pad 150 of the first wafer W1 and the third bonding pad 250 of the second semiconductor chip 200 may directly contact each other. That is, the second semiconductor chip 200 and the first wafer W1 may be bonded to each other such that the front surface of the second semiconductor chip 200 and a front surface of the first wafer W1 face each other. As the second semiconductor chip 200 and the first wafer W1 are bonded together, the first bonding pad 150 of the first wafer W1 and the third bonding pad 250 of the second semiconductor chip 200 may be bonded using pad to pad direct bonding.

Alternately, the front surface of the second semiconductor chip 200 and a back surface of the first wafer W1 may be bonded to face each other. In this case, the second imaging portion 42 may image the second alignment key patterns M2 disposed on the back surface of the first wafer W1 in order to perform the alignment.

FIGS. 14, 15, 16 and 17 are respective cross-sectional views illustrating additional method steps that may be used in the manufacture of the semiconductor package 10 of FIG. 1.

Figure 14:
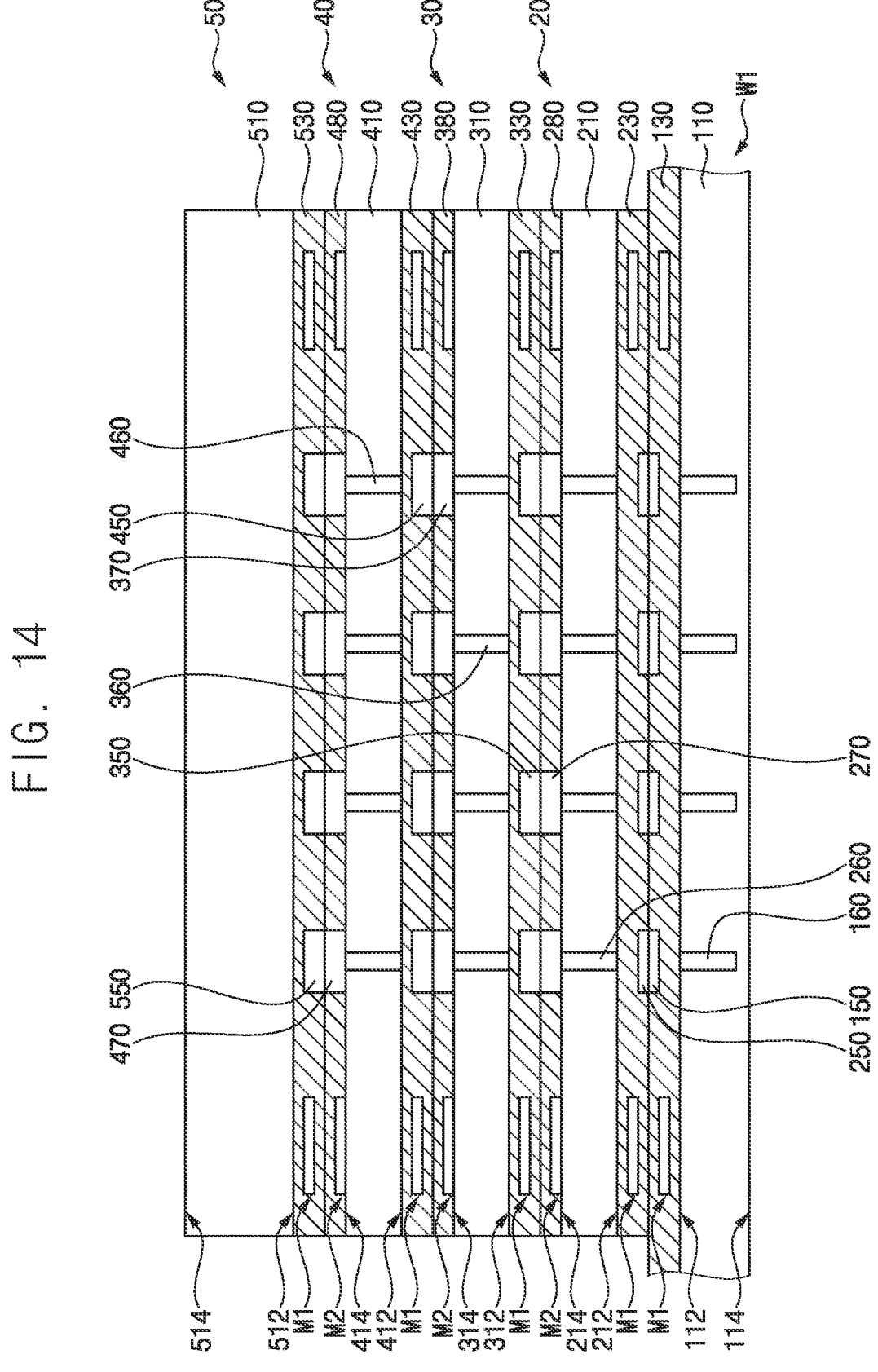

Referring to FIG. 14, processes such as those described above may be used to stack the third, fourth and fifth semiconductor chips 300, 400 and 500 on the second semiconductor chip 200. That is, the third semiconductor chip 300 may be stacked on the second semiconductor chip 200, such that a front surface of the third semiconductor chip 300 faces toward the back surface of the second semiconductor chip 200; the fourth semiconductor chip 400 may be stacked on the third semiconductor chip 300, such that a front surface of the fourth semiconductor chip 400 faces toward a back surface of the third semiconductor chip 300; and the fifth semiconductor chip 500 may be stacked on the fourth semiconductor chip 400. such that a front surface of the fifth semiconductor chip 500 faces toward a back surface of the fourth semiconductor chip 400.

By use of one or more thermal compression process(es), the third semiconductor chip 300 and the second semiconductor chip 200 may be bonded together by hybrid bonding. That is, a third front insulation layer 330 on the front surface of the third semiconductor chip 300 may be directly bonded to the second back insulation layer 280 on the back surface of the second semiconductor chip 200. As the second semiconductor chip 200 and the third semiconductor chip 300 are bonded together, the fourth bonding pad 270 of the second semiconductor chip 200 and a fifth bonding pad 350 of the third semiconductor chip 300 may be bonded using pad to pad direct bonding.

In this case, the first imaging portion 40 of FIG. 13 may be used to image the first alignment key patterns M1 of the third semiconductor chip 300, and the second imaging portion 42 may be used to image the second alignment key patterns M2 of the second semiconductor chip 200 in order to determine absolute positions of the third semiconductor chip 300 and the second semiconductor chip 200 during the alignment process.

Similarly, by use of a thermal compression process, the fourth semiconductor chip 400 and the third semiconductor chip 300 may be bonded together using hybrid bonding. That is, a fourth front insulation layer 430 on a front surface of the fourth semiconductor chip 400 may be directly bonded to a third back insulation layer 380 on a back surface of the third semiconductor chip 300. As the third semiconductor chip 300 and the fourth semiconductor chip 400 are bonded together, the sixth bonding pad 370 of the third semiconductor chip 300 and the seventh bonding pad 440 of the fourth semiconductor chip 400 may be bonded using pad to pad direct bonding.

In this case, the first imaging portion 40 may be used to image the first alignment key patterns M1 of the fourth semiconductor chip 300, and the second imaging portion 42 may be used to image the second alignment key patterns M2 of the third semiconductor chip 300 in order to determine absolute positions of the fourth semiconductor chip 400 and the third semiconductor chip 300 during the alignment process.

Similarly, by use of a thermal compression process, the fifth semiconductor chip 500 and the fourth semiconductor chip 400 may be bonded together using hybrid bonding. That is, the fifth front insulation layer 530 on a front surface of the fifth semiconductor chip 500 may be directly bonded to the fourth back insulation layer 480 on a back surface of the fourth semiconductor chip 400. As the fourth semiconductor chip 400 and the fifth semiconductor chip 500 are bonded together, the eighth bonding pad 470 of the fourth semiconductor chip 400 and the ninth bonding pad 550 of the fifth semiconductor chip 500 may be bonded using pad to pad direct bonding.

In this case, the first imaging portion 40 may be used to image the first alignment key patterns M1 of the fifth semiconductor chip 500, and the second imaging portion 42 may be used to image the second alignment key patterns M2 of the fourth semiconductor chip 400 in order to determine absolute positions of the fifth semiconductor chip 500 and the fourth semiconductor chip 400, to thereby perform an alignment process.

Those skilled in the art will appreciate that any reasonable number (e.g., 2, 4, 8, 12, 16, etc.) of stacked semiconductor chips may be included in various embodiments of the inventive concept.

Figure 15:
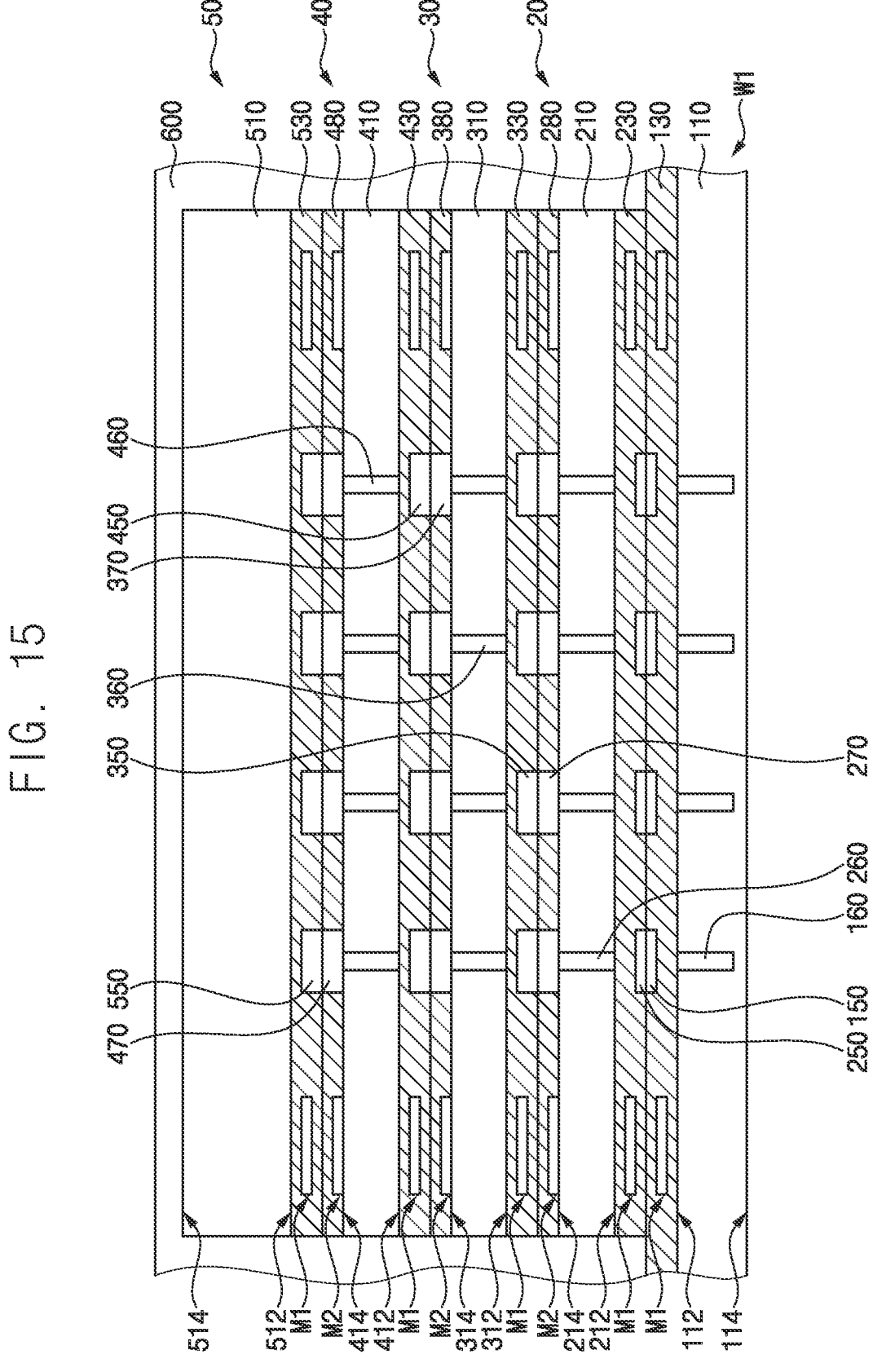

Referring to FIG. 15, a sealing member 600 may additionally be provide to substantially fill voids that may exist between the stacked semiconductor chips of the semiconductor package (e.g., the second, third, fourth and fifth semiconductor chips 200, 300, 400 and 500 dispose on the first wafer W1). In some embodiments, the sealing member 600 may be formed to substantially surround (or encompass) the stacked semiconductor chips (e.g., the second, third, fourth and fifth semiconductor chips 200, 300, 400 and 500). The sealing member 600 may be formed by a dispensing process or a spin coating process. In some embodiments, the sealing member 600 may include a thermosetting resin or the like.

Figure 16:
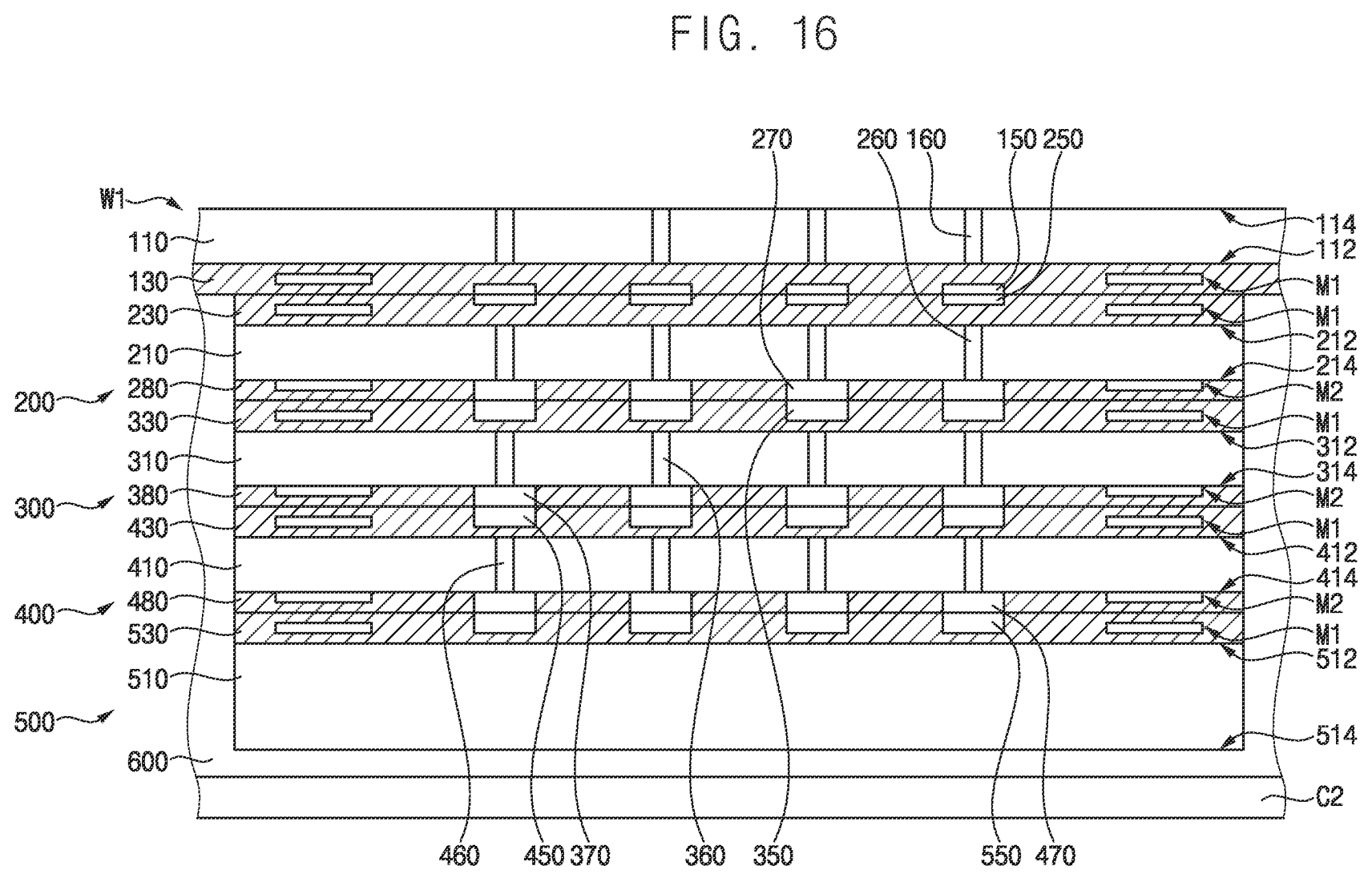
Figure 17:
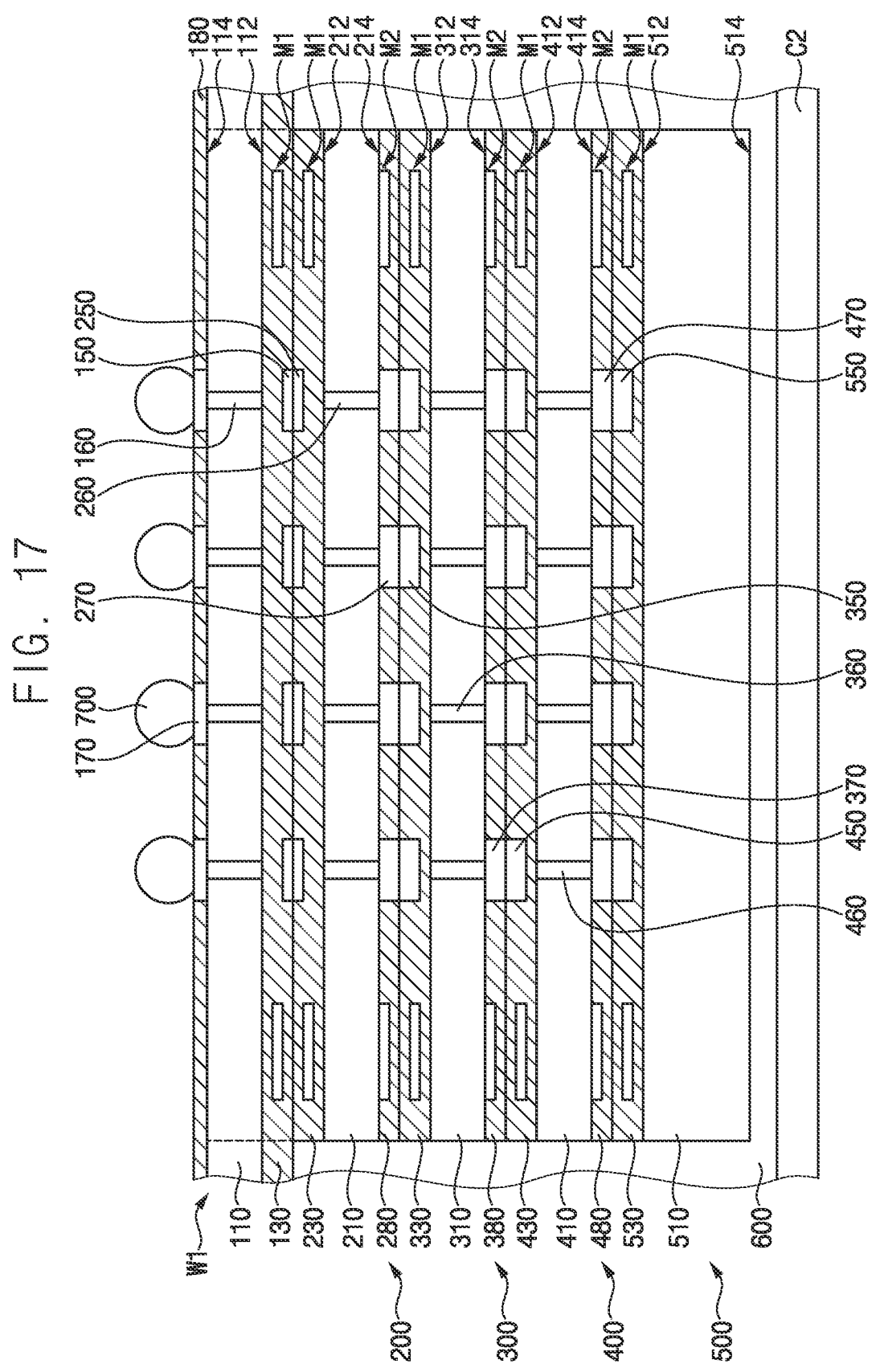

Referring to FIGS. 16 and 17, a first back insulation layer 180 having a second bonding pad 170 that is electrically connected to the first through electrode 160 may be formed on a second surface 114 of the first substrate 110 of the first wafer W1, and a solder bump 700 as a conductive connection member may be formed on the second bonding pad 170.

As shown in FIG. 16, a back (or second) surface 114 of the first substrate 110 may be reduced in thickness (e.g., subjected to a grinding process) using a substrate support system (WSS). Here, the structure described in relation to FIG. 15 may be reversed, the sealing member 600 may be attached to a carrier substrate C2 using an adhesive film, and the second surface 114 of the first substrate 110 may be partially removed until a portion of the first through electrode 160 is exposed.

As shown in FIG. 17, processes similar to those described in relation to FIG. 10 may be performed to form the first back insulation layer 180 on the second surface 114 of the first substrate 110. Then, an opening may be formed in the first back insulation layer 180 to expose the first through electrode 160 and a plating process may be performed to form the second bonding pad 170 that will be electrically connected to the first through electrode 160.

Thereafter, the solder bump 700 may be formed on the second bonding pad 170. For example, a seed layer may be formed on the second bonding pad 170 of the first back insulation layer 180, and a photoresist pattern having an opening that exposes a portion of the seed layer may be formed on the first back insulation layer 180. Then, after filling the opening of the photoresist pattern with a conductive material, the photoresist pattern may be removed and a reflow process may be performed to form the solder bump 700. In some embodiments, the conductive material may be formed on the seed layer using a plating process. Alternately, the solder bump may be formed by a screen printing process, a vapor deposition process, etc.

Thereafter, the first wafer W1 and the sealing member 600 may be cut along a scribe lane region to complete the semiconductor package in FIG. 1.

FIGS. 18A, 18B, 18C, 18D and 18E are respective plan views illustrating various exemplary structures that may be used to implement the first alignment key patterns consistent with embodiments of the inventive concept.

Figure 18A:
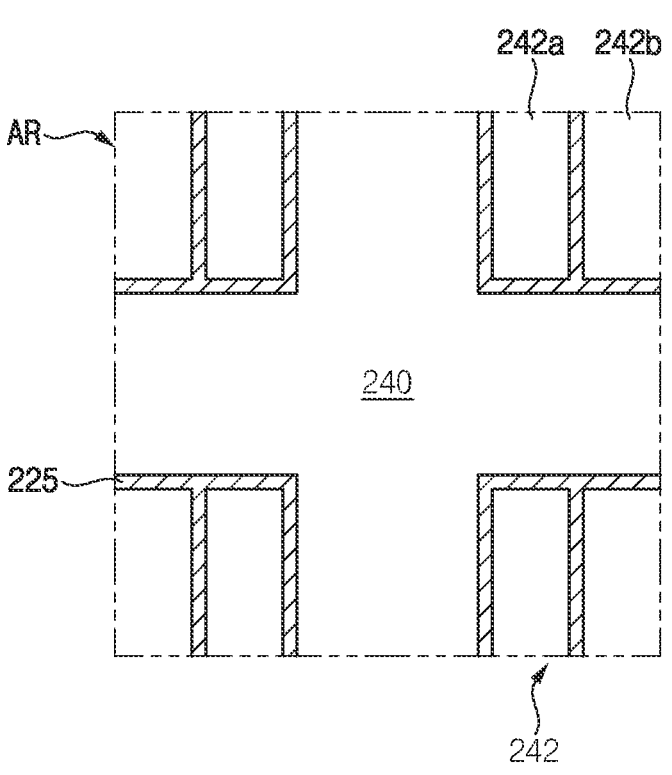
FIGS. 18A, 18B, 18C, 18D and 18E are respective plan views illustrating possible first alignment key patterns.

Referring to FIG. 18A, a first alignment key pattern may be arranged in an alignment key pattern area AR as a preset search box. The first alignment key pattern M1 may include a main pattern 240 and a four auxiliary patterns 242 around the main pattern 240 and spaced apart from each other. The main pattern 240 has a cross-shaped pattern and the four auxiliary patterns 242 are disposed at respective corner regions of the main pattern 240. Further, each of the auxiliary patterns 242 may include first and second rectangular-shaped patterns 242*a* and 242*b* arranged side by side and occupying substantially the same planar area. Alternately, the first and second rectangular-shaped patterns 242*a* and 242*b* may occupy different, respective planar areas.

Figure 18B:
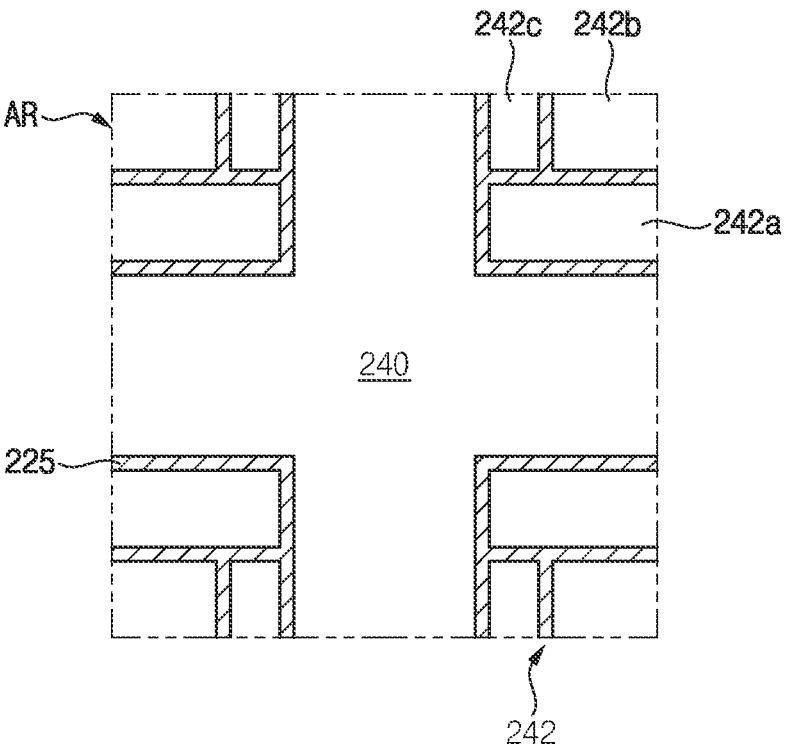

Referring to FIG. 18B and comparing the example of FIG. 18A, each of the four auxiliary patterns 242 may include a first rectangular pattern 242*a*, a second rectangular pattern 242*b* and a third rectangular pattern 242*c*. In some embodiments, the second rectangular pattern 242*b* and the third rectangular pattern 242*c* are arranged side by side along one side of the first rectangular pattern 242*a*. Each of the first rectangular pattern 242*a*, the second rectangular pattern 242*b* and the third rectangular pattern 242*c* may occupy a different planer area. For example, the first pattern 242*a* may occupy a largest planar area, the second pattern 242*b* may occupy an intermediate planar area less than the first planar area, and the third pattern 242*c* may occupy a smallest planar area less than the second planar area.

Figure 18C:
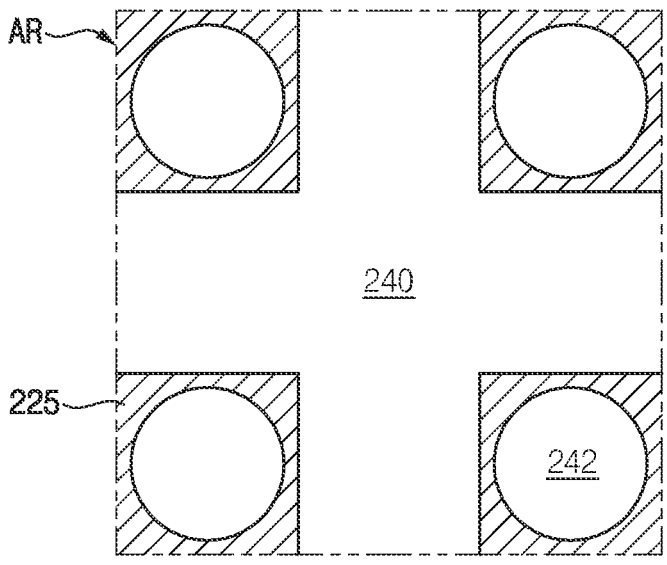

Referring to FIG. 18C, each of the four auxiliary patterns 242 may include at least one circular-shaped pattern(s).

Figure 18D:
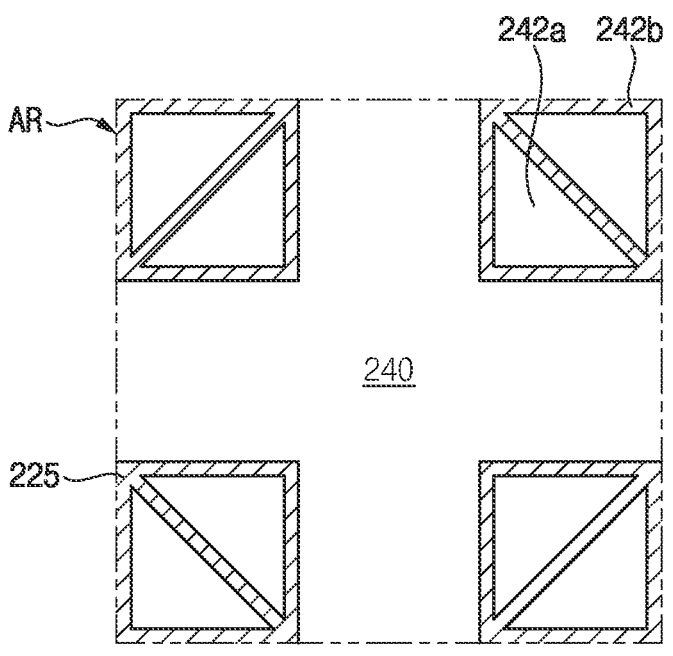

Referring to FIG. 18D, each of the four auxiliary patterns 242 may include at least one triangular-shaped pattern(s). For example the first and second patterns 242*a* and 242*b* may include two triangular-shaped patterns facing each other and occupying substantially the same planar area.

Figure 18E:
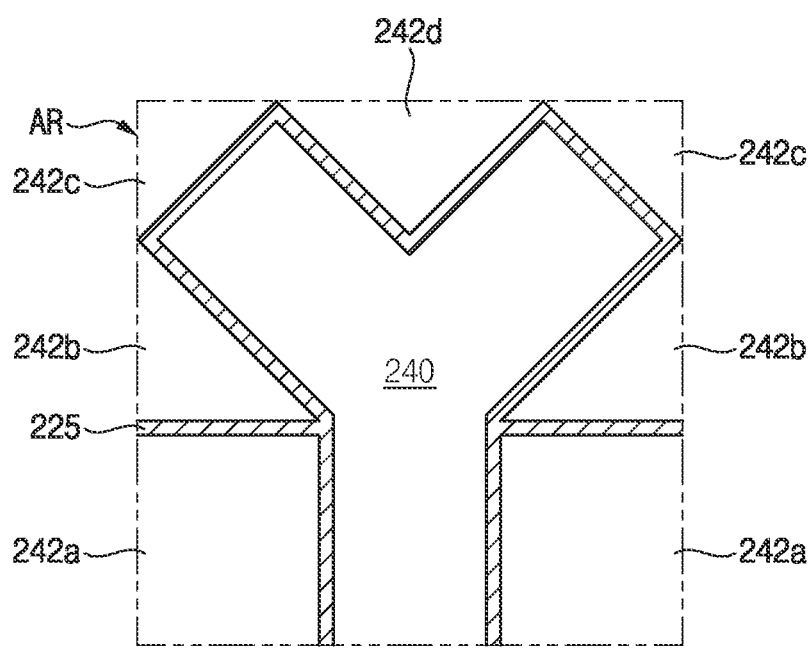

Referring to FIG. 18E, the main pattern 240 need not always have a cross-shaped pattern. Instead, as one example, the main pattern may include a Y-shaped pattern substantially surrounded by seven (7) auxiliary patterns 242 of varying shapes. Here, two of the seven auxiliary patterns 242 may be respectively disposed on both sides of a first portion of the main pattern 240, and the remaining five auxiliary patterns 242*b*, 242*c* and 242*d* may be arranged to surround a second portion of the main pattern 240 that extends in two directions from the first portion of the main pattern 240 as branches.

As noted above, semiconductor packages consistent with embodiments of the inventive concept may include various types of semiconductor devices, such as logic devices and/or memory devices. That is, semiconductor packages according to embodiments of the inventive concept may include logic devices, such as central processing units (CPUs), main processing units (MPUs), application processors (APs), etc. Other semiconductor packages according to embodiments of the inventive concept may include volatile memory devices (e.g., Dynamic Random Access Memory (RAM) (DRAM), Synchronous RAM (SRAM), HBM) and/or non-volatile memory devices (e.g., flash memory, Phase-change RAM (PRAM), Magnetic RAM (MRAM), Resistance-variable RAM (ReRAM)). Still other semiconductor packages according to embodiments of the inventive concept may include various combinations of logic devices and memory components.

In some embodiments, the main (or first) alignment key pattern and/or the auxiliary (or second) key patterns may include at least one of aluminum and copper.

In some embodiments, the auxiliary patterns may be disposed around the main pattern, such that the first alignment key pattern has a metal content (or portion) greater than about 60% of the area associated with an alignment key pattern region. Further, topology uniformity of various embodiments of the inventive concept may be improved by providing a metal density uniform between the main alignment key pattern and an insulation layer region on which the main alignment key pattern is formed. Thus, voids potentially existing between the main alignment key pattern and a passivation layer on the main pattern may be prevented and a dishing effect may be improved, to thereby improve bonding quality in a hybrid bonding process.

The foregoing illustrative of embodiments are presented by way of teaching examples. And although the certain embodiments have been described in relation to the accompanying drawings, those skilled in the art will readily appreciate that many modifications are possible without materially departing from the scope of the inventive concept as set forth by the following claims.

What is claimed is:

1. A semiconductor package, comprising:
a first semiconductor chip including:
    a first substrate including a first surface and an opposing second surface;
    a first bonding pad on the first surface of the first substrate; and
    a first passivation layer on the first surface of the first substrate exposing at least a portion of the first bonding pad; and
a second semiconductor chip stacked on the first semiconductor chip and including:
    a second substrate including a front surface and an opposing back surface;
    a second insulation layer on the front surface of the second substrate;
    a second bonding pad on the second insulation layer;
    a first alignment key pattern on the second insulation layer; and
    a second passivation layer on the second insulation layer, covering at least a portion of the first alignment key pattern, and exposing at least a portion of the second bonding pad,
wherein the first bonding pad and the second bonding pad are directly bonded, and the first passivation layer and the second passivation layer are directly bonded, and
wherein the first alignment key pattern includes a main pattern, and a plurality of auxiliary patterns around the main pattern and spaced apart from each other.

2. The semiconductor package of claim 1, wherein the first alignment key pattern includes at least one of aluminum or copper.

3. The semiconductor package of claim 1, wherein the first alignment key pattern has a first diameter and the second bonding pad has a second diameter less than the first diameter.

4. The semiconductor package of claim 3, wherein the first diameter falls in a range of between about 20 μm to about 40 μm.

5. The semiconductor package of claim 1, wherein the first alignment key pattern is in the second passivation layer.

6. The semiconductor package of claim 1, wherein the first passivation layer includes at least one of silicon nitride or silicon carbonitride and the second passivation layer includes at least one of silicon oxide or silicon nitride.

7. The semiconductor package of claim 1, wherein the second semiconductor chip further includes a second through electrode penetrating through the second substrate and electrically connected to the second bonding pad.

8. The semiconductor package of claim 1, wherein the first surface of the first substrate including the first bonding pad is a back surface of the first substrate.

9. The semiconductor package of claim 8, wherein the first semiconductor chip further includes a second alignment key pattern on the back surface of the first substrate, and the first passivation layer covers at least a portion of the second alignment key pattern.

10. A semiconductor package, comprising:
an arrangement of stacked semiconductor chips including a buffer chip, a first semiconductor chip stacked on the buffer chip, a second semiconductor chip stacked on the first semiconductor chip, a third semiconductor chip stacked on the second semiconductor chip, and a fourth semiconductor chip stacked on the third semiconductor chip;
a sealing member covering at least a portion of the arrangement of stacked semiconductor chips;

wherein each of the first semiconductor chip, the second semiconductor chip, the third semiconductor chip and the fourth semiconductor chip includes:

a substrate including a front surface and an opposing back surface;

an insulation layer on the front surface of the substrate;

a first bonding pad on the insulation layer;

a first alignment key pattern on the insulation layer, wherein the first alignment key pattern includes a main pattern and a plurality of auxiliary patterns spaced apart around the main pattern; and a first passivation layer on the insulation layer, covering at least a portion of the first alignment key pattern, and exposing at least a portion of the first bonding pad.

11. The semiconductor package of claim 10, wherein each of each of the first semiconductor chip, the second semiconductor chip, and the third semiconductor chip further includes a through electrode penetrating through the substrate and electrically connected to the first bonding pad.

12. The semiconductor package of claim 10, wherein each of the first semiconductor chip, the second semiconductor chip, and the third semiconductor chip further includes:

a second bonding pad on the back surface of the substrate; and a second passivation layer on the back surface of the substrate and exposing at least a portion of the second bonding pad.

13. The semiconductor package of claim 12, wherein each of the first semiconductor chip, the second semiconductor chip, and the third semiconductor chip further includes a plurality of second alignment key patterns on the back surface of the substrate, and the second passivation layer covers at least a portion of the plurality of second alignment key patterns.

14. The semiconductor package of claim 12, wherein the first bonding pad and the second bonding pad are directly bonded, and the first passivation layer and the second passivation layer are directly bonded.

15. The semiconductor package of claim 14, wherein each of the first bonding pad and the second bonding pad include copper, and the first alignment key pattern includes at least one of aluminum or copper.

16. The semiconductor package of claim 14, wherein the first alignment key pattern is in the first passivation layer.

17. The semiconductor package of claim 10, wherein the first alignment key pattern has a first diameter, the first bonding pad has a second diameter less than the first diameter, and the first diameter falls in a range of between about 20 μm to about 40 μm.

18. A semiconductor package, comprising:

a first semiconductor chip including a first substrate; and a second semiconductor chip including a second substrate and stacked on the first semiconductor chip, wherein the second semiconductor chip includes:

insulation layers sequentially stacked on a front surface of the second substrate;

a metal wiring structure including first wirings vertically stacked among the insulation layers;

an alignment key structure including second wirings vertically stacked among the insulation layers, wherein an uppermost one of the second wirings includes a first alignment key pattern including a main pattern and a plurality of auxiliary patterns spaced apart around the main pattern;

a second bonding pad on an uppermost one of the first wirings; and a second passivation layer on the insulation layers, covering at least a portion of the first alignment key pattern, and exposing at least a portion of the second bonding pad.

19. The semiconductor package of claim 18, wherein a number of the first wirings is equal to a number of the second wirings.

* * * * *